United States Patent
Matsumoto et al.

(10) Patent No.: US 6,756,177 B2
(45) Date of Patent: Jun. 29, 2004

(54) PHOTOPOLYMERIZABLE COMPOSITION AND RECORDING MATERIAL

(75) Inventors: Hirotaka Matsumoto, Shizuoka-ken (JP); Shintaro Washizu, Shizuoka-ken (JP); Masanobu Takashima, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 30 days.

(21) Appl. No.: 10/254,641

(22) Filed: Sep. 26, 2002

(65) Prior Publication Data

US 2003/0129521 A1 Jul. 10, 2003

(30) Foreign Application Priority Data

Sep. 27, 2001 (JP) ........................................ 2001-298172

(51) Int. Cl.$^7$ .............................................. G03F 7/028
(52) U.S. Cl. ................. 430/138; 430/281.1; 430/282.1; 430/283.1; 430/285.1; 430/286.1
(58) Field of Search .............................. 430/138, 281.1, 430/283.1, 282.1, 285.1, 286.1, 915, 926, 914

(56) References Cited

U.S. PATENT DOCUMENTS

| | | | | |
|---|---|---|---|---|
| 6,087,062 A | * | 7/2000 | Cunningham et al. | ... 430/270.1 |
| 6,096,794 A | * | 8/2000 | Cunningham et al. | ........ 522/12 |
| 6,165,686 A | * | 12/2000 | Kamata et al. | ........... 430/281.1 |
| 6,486,225 B1 | * | 11/2002 | Kamata et al. | ............... 522/14 |

* cited by examiner

Primary Examiner—Mark F. Huff
Assistant Examiner—Amanda C. Walke
(74) Attorney, Agent, or Firm—Sughrue Mion, PLLC

(57) ABSTRACT

The present invention provides a photopolymerizable composition containing a polymerizable compound having an ethylenically unsaturated bond, a compound represented by the following general formula (I), and a radical generating agent capable of generating a radical by interacting with the compound represented by the following general formula (I). General Formula (I);

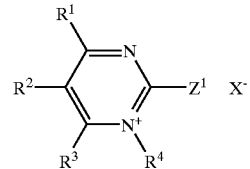

In the general formula (I), $R^1$, $R^2$, and $R^3$ each individually represent a hydrogen atom or a monovalent substituent; $R^4$ represents at least one member selected from the group consisting of: a hydrogen atom, an aliphatic group, an aromatic group, and a heterocyclic group; $Z^1$ represents a substituent necessary for allowing the compound represented by the general formula (I) to become a dye; and $X^-$ represents a group capable of forming an anion. The invention also provides a recording material in which a recording layer containing the photopolymerizable composition is provided on a support.

19 Claims, No Drawings

PHOTOPOLYMERIZABLE COMPOSITION AND RECORDING MATERIAL

BACKGROUND OF THE INVENTION

1. Field of Invention

The present invention relates to a novel photopolymerizable composition and a recording material and, more particularly, to a pyrimidine type photopolymerizable composition using an organic dye which is highly sensitive to a laser and has a superior storage stability before use, and a recording material which can be favorably used in a broad variety of fields, such as inks, color filters, holograms, proofs, sealants, adhesives, planography, resin letterpresses, and photoresists.

2. Description of the Related Art

A photopolymerizable composition, basically comprising a photopolymerization initiator and an addition-polymerizable compound (hereinafter also referred to as a "polyfunctional monomer") containing at least two ethylenically unsaturated bonds in a molecule, is cured, changes tackiness, and becomes insoluble in a solvent when irradiated with light. Making use of these characteristics, the photopolymerizable composition is broadly used in, for example, photography, printing, metal surface treatments, and inks. Function and application examples of the photopolymerizable compound have been described in a number of published documents. For example, detailed description thereof can be found on pp. 158–193 of "Light Sensitive Systems" by J. Kosar (J. Wiley & Sons, New York, 1965) and on pp. 181–222 of "Imaging Systems" by K. I. Jacobson and R. E. Jacobson (J. Wiley & Sons, New York, 1976).

Further, in recent years, an image forming system utilizing a photosensitive microcapsule, i.e., a microcapsule that encapsules the photopolymerizable composition has been proposed as an image forming method utilizing the photopolymerizable composition. For example, Japanese Patent Application Laid-Open (JP-A) Nos. 57-124343, 57-179836, and 57-197538, describe a method for forming a dye image including the steps of exposing to light a color forming sheet on which the microcapsules encapsulating a dye and the photopolymerizable composition, which comprises a vinyl compound and a photopolymerization initiator, has been coated, laminating an image receiving sheet on the thus-exposed color forming sheet, and applying pressure to the entire resulting laminate.

Further, JP-A Nos. 3-87827 and 4-211252 disclose a photosensitive thermal color-forming recording material containing two components, of which one component is microencapsulated and the other component is either a curable compound of a photocurable composition or included outside of the microcapsules together with the photocurable composition. In the case of the latter recording material, a photosensitive thermal recording material provided with a layer comprising microcapsules, which encapsulate an electron donating colorless dye, and a photocurable composition which is included outside of the microcapsules and contains an electron accepting compound, a polymerizable vinyl monomer and a photopolymerization initiator, is illustrated.

Such a recording material utilizing the photopolymerizable composition as described above is particularly advantageous from an environmental standpoint since the recording material is capable of performing image recording by a completely dry process without using a developing liquid or the like and, accordingly, generates no waste.

Further, when performing image recording on the photosensitive recording material, the possibility of utilizing not only ultraviolet light and short-wavelength visible light, but also a low-cost infrared laser and light in the range from blue to red is advantageous. However, there are many recording materials utilizing the photopolymerizable composition that are sensitive to ultraviolet light but not sensitive or not sufficiently sensitive to light in the range from visible light to infrared light. As a result, there are cases in which a formed image is not sharp or a contrast between an image portion and a non-image portion is deteriorated, and thus further enhancement of sensitivity has been desired.

In order to enhance sensitivity to light for image recording (writing), a spectral sensitizing dye is generally used in these recording materials. As a result, exposing the recording materials again after a recorded image is obtained to light that the dye can absorb in order to decompose the dye and thereby discolor a hue that the dye remaining in the recording material exhibits has been known. However, there are some cases in which such decoloration can not be sufficiently performed whereby there are problems, for example, in that, due to partially remaining color, sharpness of hue or contrast is deteriorated and it takes a prolonged period of time to carry out the decoloring. Hence, further improvements are desired.

SUMMARY OF THE INVENTION

The present invention has a problem to solve the above-described problems of the prior art and attain objects. described below.

Namely, the object of the present invention is to provide a photopolymerizable composition which is sensitive not only to ultraviolet light, but also from visible light to infrared light in a high sensitive manner. Another object of the present invention is to provide a recording material which is capable of performing a high sensitive image recording by using not only the ultraviolet light but also from the visible light to the infrared light, is excellent in a decoloring property of a non-image portion (base portion), and can form a sharp high-contrast image either in black-and-white or color in a completely dry processing system which does not require a need for use of a developing liquid and, accordingly, does not generate wastes.

The above-described problems are solved by provision of the photopolymerizable composition and the recording material described below.

An aspect of the present invention is a photopolymerizable composition, comprising a polymerizable compound having an ethylenically unsaturated bond, a compound represented by the following general formula (I), and a radical generating agent capable of generating a radicals by interacting with the compound represented by the general formula (I):

General Formula (I)

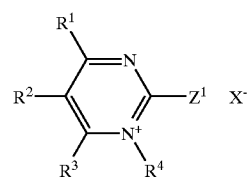

wherein, in the general formula (I), $R^1$, $R^2$, and $R^3$ each individually represent a hydrogen atom or a monovalent substituent;

R⁴ represents at least one member selected from the group consisting of a hydrogen atom, an aliphatic group, an aromatic group, and a heterocyclic group;

$Z^1$ represents a substituent necessary for allowing the compound expressed by the general formula (1) to become a dye; and $X^-$ represents a group capable of forming an anion.

An another aspect of the present invention is the photopolymerizable composition, wherein the radical generating agent is an organic boron compound.

An another aspect of the present invention is the photopolymerizable composition, wherein the organic boron compound is a compound represented by the following general formula (II):

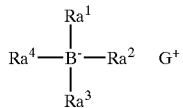

General Formula (II)

wherein, in the general formula (II), $R_a^1$, $R_a^2$, $R_a^3$, and $R_a^4$ each individually represent at least one member selected from the group consisting of: an aliphatic group, an aromatic group, a heterocyclic group, and $Si(R_a^5)(R_a^6)$—$R_a^7$, wherein $R_a^5$, $R_a^6$, and $R_a^7$ each individually represent at least one of an aliphatic group and an aromatic group; and $G^-$ represents a group capable of forming a cation.

An another aspect of the present invention is a recording material comprising a support and a first recording layer provided thereon, the first recording layer comprising the photopolymerizable composition.

An another aspect of the present invention is the recording material wherein the radical generating agent is an organic boron compound.

An another aspect of the present invention is the recording material wherein the organic boron compound is a compound represented by the general formula (II).

An another aspect of the present invention is the recording material wherein the recording layer further comprises at least a color forming component A, and a color forming component B having a portion which allows color to be formed by reacting with the color forming component A.

An another aspect of the present invention is the recording material wherein the color forming component B is at least one polymerizable compound having an ethylenically unsaturated bond.

An another aspect of the present invention is the recording material wherein the polymerizable compound having an ethylenically unsaturated bond is a color-forming suppressing compound that contains in the same molecule a component that suppresses a reaction between the color forming component A and the color forming component B.

An another aspect of the present invention is the recording material wherein the color forming component A is encapsulatd in microcapsules.

An another aspect of the present invention is the recording material, further comprising a multi-layer structure in which the first recording layer that is sensitive to light having a central wavelength $\lambda_1$, a second recording layer that is sensitive to light having a central wavelength $\lambda_2$ and forms a color different from that of the first recording layer, . . . , and an ith recording layer that is sensitive to light having a wavelength $\lambda_i$ and forms a color different from those of the first, second, . . . , and i–1th recording layers are laminated in this order.

DETAILED DESCRIPTION OF THE INVENTION

A photopolymerizable composition according to the present invention is characterized by containing a compound having a pyrimidine nucleus expressed by the general formula (I) as a compound which can interact with a radical generating agent, that is, a spectral sensitizing agent. Further, in the recording material according to the present invention, a recording layer on a support is characterized by containing a color forming component and the like, as well as the above-described photopolymerizable composition according to the present invention.

Hereinafter, the photopolymerizable composition according to the present invention is described and details of a pyrimidine type organic dye and the recording material will be clarified through such description.

Photopolymerizable Composition

A photopolymerizable composition according to the present invention contains a polymerizable compound having an ethylenically unsaturated bond, a compound expressed by the general formula (I), and a radical generating agent which is capable of generating a radical by interacting with the above-described compound as essential components and may, optionally, contain any of other components.

Polymerizable Compound Having an Ethylenically Unsaturated Bond

A photopolymerizable composition according to the present invention contains a polymerizable compound having an ethylenically unsaturated bond (hereinafter referred to also as "polymerizable compound").

The above-described polymerizable compound that is preferably a plymerizable compound which has at least one ethylenically unsaturated double bond in a molecule is not particularly limited and can appropriately be selected in accordance with purposes; on this occasion, examples of the polymerizable compounds include acrylic acid esters, acrylic acid derivatives such as acrylamides, acrylic acid and a salt thereof, methacrylic acid esters, methacrylic acid derivatives such as methacrylamides, methacrylic acid and a salt thereof, maleic anhidride, maleic acid esters, itaconic acid, itaconic acid esters, styrene, vinyl ethers, vinyl esters, N-vinyl heterocycles, allyl ethers, and allyl esters.

The above-described polymerizable compound has at least one olefinic double bond therein and may be any one of a low-molecular weight type (monomer type) and a high molecular weight type (oligomer type).

Examples of monomers having a double bond include alkyl (or hydroxyalkyl) acrylate (methacrylate) such as methyl acrylate, ethyl acrylate, butyl acrylate, 2-ethylhexyl acrylate, 2-hydroxyethyl acrylate, isobornyl acrylate, methyl mathacrylate, and ethyl methacrylate. Silicon acrylate is also advantageously included.

Other examples than those described above include acrylonitrile, acrylamide, methacrylamide, N-substituted (meth) acrylamide, a vinyl ester such as vinyl acetate, a vinyl ether such as isobutyl vinyl ether, styrene, an alkyl- and halo-styrene, N-vinyl pyrrolidone, vinyl chloride, and vinylidene chloride.

Examples of monomers having at least two or more double bonds include diacrylates of, for example, ethylene glycol, propylene glycol, neopentyl glycol, hexamethylene glycol, and bisphenol-A, 4,4'-bis(2-acryloyloxyethoxy) diphenyl propane, trimethylolpropane triacrylate, pentaerythritol triacrylate (or tetracrylate), vinyl acrylate, divinylbenzene, divinyl succinate, diallyl phthalate, triallyl phosphate, triallyl isocyanulate, and tris(2-acryloylethyl) isocyanulate.

Examples of multi-unsaturated compounds of a relatively high molecular weight type (oligomer type) include an epoxy resin having a (meth)acrylic group, a polyester having a (meth)acrylic group, a polyester containing a vinyl ether or an epoxy group, polyurethane, and a polyether. Further, examples of unsaturated oligomers include an unsaturated polyester resin which is ordinarily produced by maleic acid, phthalic acid and at least one type of diols and has a molecular weight of from about 500 to about 3000. Furthermore, a vinyl ether monomer and an oligomer thereof, and an oligomer which has a polyester, polyurethane, a polyether, a polyvinyl ether or epoxy as a main chain and is terminated with a maleate can also be used. Particularly preferable is a combination of an oligomer having a vinyl ether group and a polymer described in WO 90/01512. Further, also preferable are a copolymer of a vinyl ether and a monomer functionalized with maleic acid. The unsaturated oligomer of this type can belong to a category of prepolymers.

Particularly preferable examples thereof include esters of ethylenically unsaturated carboxylic acids and polyols or polyepoxides, polymers each having an ethylenically unsaturated group in a main or side chain, for example, unsaturated polyesters, polyamides, polyurethanes and copolymers thereof, alkyd resins, polybutadiene and butadiene copolymers, polyisoprene and isoprene copolymers, polymers having a (meth)acylic group in a side chain thereof and copolymers thereof, and mixtures of at least any two types of the above-described polymers.

Examples of unsaturated carboxylic acids include acrylic acid, methacrylic acid, crotonic acid, itaconic acid, cinnamic acid, and unsaturated fatty acids such as linoleic acid, oleic acid. Among these acids, acrylic acid and methacrylic acid are preferable.

Aromatic polyols are preferable and aliphatic and cycloaliphatic polyols are particularly preferable. Examples of aromatic polyols include hydroquinone, 4,4'-dihydroxydiphenyl, 2,2-di(4-hydroxyphenyl)propane, novolak, and resorcin. Examples of polyepoxides include the above-described polyols, particularly, those based on aromatic polyols and epichlorohydrin. Examples of other preferable polyols include polymers each containing a hydroxyl group in a polymer chain or a side chain and copolymers thereof, for example, polyvinyl alcohol and copolymers thereof, polyhydroxyalkylmethacrylate and copolymers thereof. Examples of still other preferable polyols include oligoesters having a terminal hydroxyl group.

Examples of aliphatic and cycloaliphatic polyols include an alkylene diols, preferably, each having from 2 to 12 carbon atoms, for example, ethylene glycol, 1,2- or 1,3-propanediol, 1,2-, 1,3- or 1,4-butanediol, pentanediol, hexanediol, octanediol, dodecanediol, diethylene glycol and triethylene glycol, polyethylene glycol, preferably, having a molecular weight of from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol, and sorbitol.

Polyols can be esterified either partially or completely by one type of carboxylic acid or different types of unsaturated carboxylic acid and, in such partial esterification, a free hydroxyl group can be modified, for example, can be either etherified or esterified by another carboxylic acid.

Examples of such esters include trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentacrylate, dipentaerythritol hexacrylate, tripentaerythritol octaacylate, pentaerythritol dimethacrylate, pentaerythritol trimethacrylate, dipentaerythritol dimethacrylate, dipentaerythritol tetramethacrylate;

tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacryalte, sorbitol pentaacrylate, sorbitol hexaacrylate, oligoester acrylate or methacrylate, glycelol diacrylate or triacrylate, 1,4-cyclohexane diacrylate, bisacrylate or bismethacrylate of ethylene glycol having a molecular weight of from 200 to 1500 and mixtures thereof.

Preferable examples of the above-described polymerizable compounds include amides of same or different unsaturated carboxylic acids and an aromatic, a cycloaliphatic or an aliphatic polyamine having amino groups of from 2 to 6, particularly from 2 to 4.

Examples of such polyamines include ethylene diamine, 1,2- or 1,3-propylene diamine, 1,2-, 1,3- or 1,4-butylene diamine, 1,5-pentylene diamine, 1,6-hexylene diamine, octylene diamine, dodecylene diamine, 1,4-diaminocyclohexane, isophorone diamine, phenylene diamine, bisphenylene diamine, di-β-aminoethy ether, diethylene triamine, triethylene tetramine, di(β-aminoethoxy)- or di(β-aminopropoxy)ethane. As other examples thereof, polymers, preferably having a further amino group in a side chain thereof and coplymers thereof, and oligoamides having a terminal amino group are favorable. Examples of such unsaturated amides include methylenebisacrylamide, 1,6-hexamethylenebisacrylamide, diethylene triamine trismethacrylamide, bis(methacrylamidopropoxy)ethane, β-methacrylamidoethylmethacrylate, N-[(β-hydroxyethoxy)ethyl]acrylamide and the like.

A preferable unsaturated polyester and polyamides are derived from maleic acid and a diol or a diamine. Some of a plurality of maleic acid can be replaced by other dicarboxylic acid and these can be used together with an ethylenically unsaturated comonomer, such as styrene. The polyesters and polyamides can be derived from dicarboxylic acid, and an ethylenically unsaturated diol or diamine which, particularly, have a relatively long chain, for example, of from 6 to 20 carbon atoms. Examples of polyurethane include such polyurethane as is constituted by a saturated or unsaturated diisocyanate, and respective unsaturated or saturated diols.

Polybutadiene, polyisoprene and copolymers thereof are well known in the art. Preferable examples of comonomers include olefins, such as, ethylene, propene, butene and hexene, (meth)acylate, acrylonitrile, styrene and vinyl chloride. Polymers having a (meth)acrylate group in a side chain thereof are also well known in the art. For example, they can be a reaction product between a novolak-based epoxy resin and (meth) acrylic acid, a homopolymer or copolymer of vinyl alcohol or a hydroxyalkyl derivative thereof prepared by being esterified by (meth)acrylic acid, or a homopolymer or copolymer of a (meth)acrylate esterified by a hydroxyalkyl (meeth)acrylate.

The above-described polymerizable compound may be a compound having a portion which exhibits another function in a structure thereof in accordance with an application of the photopolymerizable composition; for example, when the photopolymerizable composition is utilized in the recording material, the above-described polymerizable compound may have a portion which promotes a color forming reaction of a color forming component constitutig an image portion or a portion which suppresses color forming; these features will be described in the pages that follow.

A content of the the above-described polymerizable compound having the ethylenically unsaturated bond is generally from 10% by weight to 99% by weight, and preferably from 30% by weight to 95% by weight, based on the total weight of the photopolymerizable composition.

Compound Expressed by the General Formula (I)

In the present invention, a compound expressed by the following general formula (I) as a spectral sensitizing dye is contained. The above-described dye is a pyrimidine type dye and has a function which spectrally sensitizes a radical generating agent. Therefore, when light of from visible light to infrared light corresponding to absorption of the above-described dye is irradiated, even in a case in which the radical generating agent that does not have absorption in such a range is contained, generation of a radical from the radical generating agent can be promoted. Further, since the above-described dye shows a high decoloring property when irradiated by light, it is advantageous that, when the dye is used in a recording material utilizing the photopolymerizable composition to be described below, a fog density in a base portion is suppressed to allow a sharp image having a high contrast to be formed.

General Formula (I)

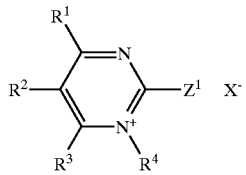

wherein $R^1$, $R^2$, and $R^3$ each individually represent a hydrogen atom, or a monovalent substituent; $R^4$ represents a member selected from the group consisting of: a hydrogen atom, an aliphatic group, an aromatic group, and a heterocyclic group; $Z^1$ represents a substituent which is necessary for allowing the compound expressed by the general formula (I) to be a dye; and $X^{-1}$ represents a group which can form an anion.

As the monovalent substituent represented by $R^1$, $R^2$, or $R^3$ in the above-described general formula (I), an alkyl group, an alkenyl group, an alkynyl group, an aryl group, a heterocyclic group or the like is mentioned. When $R^1$, $R^2$, or $R^3$ represents the alkyl group, examples of such alkyl groups include those of a straight-chain type, a branched-chain type, and a cyclic type. The alkyl group may either be an alkyl group which has a substituent or an alkyl group which does not have a substituent. AS the alkyl group represented by $R^1$, $R^2$, or $R^3$, an alkyl group having carbon atoms of 30 or less is preferable.

Examples of these alkyl groups include a methyl group, an ethyl group, a propyl group, a butyl group, a pentyl group, an octyl group, a decyl group, a dodecyl group, and an octadecyl group. When $R^1$, $R^2$, or $R^3$ represents the alkyl group having a substituent, examples of such substituents include a carboxyl group, a sulfo group, a cyano group, a halogen atom (for example, a fluorine atom, a chlorine atom, or a bromine atom), a hydroxy group, an alkoxy, an alkoxy-carbonyl group having 30 carbon atoms or less (for example, a methoxycarbonyl group, an ethoxycarbonyl group, or a benzyloxycarbonyl group), an alkanesulfonylaminocarbonyl group having 30 carbon atoms or less, an acylaminosulfonyl group having 30 carbon atoms or less, an alkoxy group having 30 carbon atoms or less (for example, a methoxy group, an ethoxy group, a benzyloxy group, or a phenethyloxy group), an alkylthio group having 30 carbon atoms or less (for example, a methylthio group, an ethylthio group, or a methylthioethylthioethyl group), an aryloxy group having 30 carbon atoms or less (for example, a phenoxy group, a p-tolyloxy group, a 1-naphthoxy group, or a 2-naphthoxy group), an acyloxy group having 30 carbon atoms or less (for example, an acetyloxy group, or a propionyloxy group), an acyl group having 30 carbon atoms or less (for example, an acetyl group, a propionyl group, or a benzoyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), and an aryl group having 30 carbon atoms or less (for example, a phenyl group, a 4-chlorophenyl group, a 4-methylphenyl group, or an a-naphthyl group).

When $R^1$, $R^2$, or $R^3$ represents an alkenyl group, examples of such alkenyl groups include an alkenyl group of any one of a straight-chain type, a branched-chain type, and a cyclic type, an alkenyl group having a substituent, and an unsubstituted alkenyl group. When $R^1$, $R^2$, or $R^3$ represents the alkenyl group having a substituent, as such substituents, mentioned are same substituents as those in a case in which the above-described $R^1$, $R^2$, or $R^3$ has the substituent. When $R^1$, $R^2$, or $R^3$ represents the alkenyl group, as such an alkenyl group, an alkenyl group having 30 carbon atoms or less is preferable.

When $R^1$, $R^2$, or $R^3$ represents the alkynyl group, examples of such alkynyl groups include alkynyl groups of any one of a straight-chain type, a branched-chain type and a cyclic type, an alkynyl group having a substituent, and an unsubstituted alkynyl group. When $R^1$, $R^2$, or $R^3$ represents the alkynyl group having a substituent, as such substituents, mentioned are same substituents as those in a case in which the above-described $R^1$, $R^2$, or $R^3$ has the substituent. When $R^1$, $R^2$, or $R^3$ represents the alkynyl group, as such an alkynyl group, an alkynyl group having 30 carbon atoms or less is preferable.

When $R^1$, $R^2$, or $R^3$ represents the aryl group, examples of such aryl groups include an aryl group having a substituent, and an unsubstituted aryl group. As the aryl group which $R^1$, $R^2$, or $R^3$ represents, an aryl group having from 6 to 30 carbon atoms is preferable. As such aryl groups, mentioned are a phenyl group, an α-naphthyl group, a β-naphthyl group, and the like. When $R^1$, $R^2$, or $R^3$ represents an aryl group having a substituent, as such substituents, mentioned are the same substituents as those in a case in which the above-described $R^1$, $R^2$, or $R^3$ has the substituent.

When $R^1$, $R^2$, or $R^3$ represents the heterocyclic group, examples of such heterocyclic groups include a heterocyclic group having a substituent, and an unsubstituted heterocyclic group. As the heterocyclic group which $R^1$, $R^2$, or $R^3$ represents, a heterocyclic group having from 4 to 13 carbon atoms is preferable. As such heterocyclic groups, mentioned are a nitrogen-containing heterocyclic group, an oxygen-containing heterocyclic group, and a sulfer-containing heterocyclic group, and specifically mentioned are a pyridine ring, a pyridazine ring, a pyrimidine ring, a pyridazone ring, a quinoline ring, an isoquinoline ring, a quinoxaline ring, an acridine ring, a furan ring, an oxazole ring, a thiazole ring, an oxadiazole ring, a thiazoline ring, a thiophene ring, an indole ring and the like. When $R^1$, $R^2$, or $R^3$ represents a heterocyclic group having a substituent, as such substituents, mentioned are the same substituents as those in a case in which the above-described $R^1$, $R^2$, or $R^3$ has the substituent.

Particularly, it is preferable that $R^1$, $R^2$, or $R^3$ is an unsubstituted alkyl group (for example, a methyl group, an ethyl group, an n-propyl group, an n-butyl group, an n-pentyl group, an n-hexyl group, an octyl group, or an octadecyl group), or a substituted alkyl group. Preferable examples of preferable substituted alkyl groups include alkoxyalkyl group (for example, a methoxyethyl group, or a phenoxyethyl group), and alkoxycarbonylalkyl group (for example, a butoxycarbonylmethyl group, or a phenoxyethoxycarbonylmethyl group). Further, $R^1$ and $R^2$ may each individually combine with an adjacent substituent with each other to form a ring; on this occasion, examples of such rings include 5-membered heterocycles and 6-membered heterocycles.

$R^4$ in the above-described general formula (I) represents anyone member selected from the group consisting of: a hydrogen atom, an aliphatic group, an aromatic group, and a heterocyclic group.

In a case in which $R^4$ represents an aliphatic group, examples of such aliphatic groups include an alkyl group, a substituted alkyl group, an alkenyl group, a substituted alkenyl group, an alkynyl group, a substituted alkynyl group, an aralkyl group, and a substituted aralkyl group. Among these groups, the alkyl group, the substituted alkyl group, the alkenyl group, the substituted alkenyl group, the aralkyl group, and the substituted aralkyl group are preferable, and, above all, the alkyl group and the substituted alkyl group are particularly preferable.

Further, the above-described aliphatic groups may either be a cyclic aliphatic group or a chain aliphatic group; on this occasion, the chain aliphatic group may have a branched chain.

The above-described alkyl groups represented by $R^4$ may be of any one of straight-chain, branched-chain, and cyclic types. A number of carbon atoms thereof is preferably from 1 to 30, and more preferably from 1 to 20. These alkyl groups may either be substituted or unsubstituted; on this occasion, a preferable range of a number of carbon atoms of an alkyl portion of the substituted alkyl group is same as in the alkyl group.

Examples of the above-described alkyl groups include a methyl group, an ethyl group, a propyl group, a butyl group, a pentyl group, a hexyl group, a cyclopentyl group, a neopentyl group, an isopropyl group, an isobutyl group, a cyclohexyl group, an octyl group, a 2-ethylhexyl group, a decyl group, a dodecyl group, and an octadecyl group.

Examples of substituents of the above-described substituted alkyl groups include a carboxyl group, a sulfo group, a cyano group, a halogen atom (for example, a fluorine atom, a chlorine atom, or a bromine atom), a hydroxy group, an alkoxycarbonyl group having 30 carbon atoms or less (for example, a methoxycarbonyl group, an ethoxycarbonyl group, or a benzyloxycarbonyl group), an alkylsulfonylaminocarbonyl group having 30 carbon atoms or less, an arylsulfonylaminocarbonyl group, an alkylsulfonyl group, an arylsulfonyl group, an acylaminosulfonyl group having 30 carbon atoms or less, an alkoxy group having 30 carbon atoms or less (for example, a methoxy group, an ethoxy group, a benzyloxy group, or a phenethyloxy group), an alkylthio group having 30 carbon atoms or less (for example, a methylthio group, an ethylthio group, or a methylthicethylthioethyl group), an aryloxy group having 30 carbon atoms or leas (for example, a phenoxy group, a p-tolyloxy group, a 1-naphthoxy group, or a 2-naphthoxy group), a nitro group, an alkyl group having 30 carbon atoms or less, an alkoxycarbonyloxy group, an aryloxycarbonyloxy group;

an acyloxy group having 30 carbon atoms or less (for example, an acetyloxy group, or a propionyloxy group), an acyl group having 30 carbon atoms, or less (for example, an acetyl group, a propionyl group, or a benzoyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group having 30 carbon atoms or less (for example, a phenyl group, a 4-chlorophenyl group, a 4-methylphenyl group, or an α-naphthyl group), a substituted amino group (for example, an amino group, an alkylamino group, a dialkylamino group, an arylamino group, a diarylamino group, or an acylamino group), a substituted ureide group, a substituted phosphono group, a heterocyclic group or the like. Among above-described groups, the carboxyl group, the sulfo group, the hydroxy group and the phosphono group may each be in a salt state. On this occasion, a cation for use in forming such a salt includes $G^+$ or the like which will be described below.

As the above-described alkenyl groups represented by $R^4$, any one of straight-chain, branched-chain and cyclic types is permissible. A number of carbon atoms thereof is preferably from 2 to 30, and more preferably from 2 to 20. Further, the above-described alkenyl group may either be substituted or unsubstituted; on this occasion, a preferable range of a number of carbon atoms of an alkenyl portion of the substituted alkenyl group is same as in the alkenyl group.

As substituents of the above-described substituted alkenyl groups, mentioned are the same substituents as in the above-described substituted alkyl groups.

As the above-described alkynyl groups represented by $R^4$, any one of straight-chain, branched-chain and cyclic types is permissible. A number of carbon atoms thereof is preferably from 2 to 30, and more preferably from 2 to 20. Further, the above-described alkynyl group may either be substituted or unsubstituted; on this occasion, a preferable range of a number of carbon atoms of an alkynyl portion of the substituted alkynyl group is same as in the alkynyl group.

As substituents of the substituted alkynyl groups, mentioned are same substituents as in the above-described substituted alkyl groups.

As the above-described aralkyl groups represented by $R^4$, any one of straight-chain, branched-chain and cyclic types is permissible. A number of carbon atoms thereof is preferably from 7 to 35, and more preferably from 7 to 25. Further, the above-described aralkyl group may either be substituted or unsubstituted; on this occasion, a preferable range of a number of carbon atoms of an aralkyl portion of the substituted aralkyl group is same as in the aralkyl group.

As substituents of the substituted aralkyl groups, mentioned are same substituents as in the above-described substituted alkyl groups.

When the above-described $R^4$ represents an aromatic group or an alkyl group, mentioned are, for example, an aryl group and a substituted aryl group as the above-described aromatic groups. A number of carbon atoms of the aryl group is preferably from 6 to 30, and more preferably from 6 to 20. A preferable range of a number of carbon atoms of an aryl part of the substituted aryl group is same as in the aryl group, Examples of the above-described aryl groups include a phenyl group, an α-naphthyl group, and a β-naphthyl group.

As substituents of the substituted aryl groups, mentioned are same substituents as in the above-described substituted alkyl groups.

When the above-described $R^4$ represents a heterocyclic group, mentioned are the heterocyclic group having a substituent and an unsubstituted heterocyclic group as the above-described heterocyclic group. As the substituent of the heterocyclic group having the substituent, mentioned are same substituents as those exemplified in a case in which $R^4$ represents the substituted aryl group, Among them, as the heterocyclic group which $R^4$ represents, the heterocyclic group having a nitrogen atom, a sulfur atom or an oxygen atom, such as a furan ring, a pyrrole ring, an imidazole ring, an oxazole ring, a thiazole ring, or a pyridine ring is preferable.

$Z^1$ in the above-described general formula (I) represents a substitute which is necessary for allowing a compound expressed by the above-described general formula (I) to become a dye. As such a substitute, mentioned is a group which is capable of forming a conjugated chain.

Among compounds expressed by the above-described general formula (I), a compound expressed by the following general formula (III) is preferable:

General Formula (III)

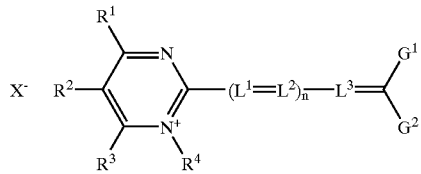

Wherein from $L^1$ to $L^3$ each individually represent a methine group which may have been substituted. When from $L^1$ to $L^3$ each individually represent a methine group, examples of such methine groups include a methine group having a substituent and an unsubstituted methine group. When from $L^1$ to $L^3$ each individually represent the methine group having a substituent, such substituents are the same substituents as those in a case in which the above-described $R^1$ and $R^2$ have substituents; on this occasion, these substituents may each have formed a ring (for example, 5-membered carbon ring, or 6-membered carbon ring) with another methine group or may have formed a ring with an auxochrome.

In the above-described general formul (III), $G^1$ and $G^2$ each individually represent an electron attractive group or $G^1$ and $G^2$ combine with each other to form an aromatic ring or a heterocycle. The electron attractive group represented by $G^1$ and $G^2$ signifies a substituent in which a σ Hammett value is positive. Examples of such electron attractive groups represented by $G^1$ and $G^2$ preferably include an acyl group such as an acetyl group, a propionyl group, a pivaloyl group, a chloroacetyl group, a trifluoroacetyl group, a 1-methylcyclopropylcarbonyl group, a 1-ethylcyclopropylcarbonyl group, a 1-benzylcyclopropylcarbonyl group, a benzoyl group, a 4-methoxybenzoyl group, or a thenoyl group, an oxycarbonyl group such as a methoxycarbonyl group, an ethoxycarbonyl group, a 2-methoxyethoxycarbonyl group, or a 4-methoxyphenoxycarbonyl group, a carbamoyl group such as a carbamoyl group, an N,N-dimethylcarbamoyl group, an N,N-diethylcarbamoyl group, an N-phenylcarbamoyl group, an N-2,4-bis(pentyloxy)phenylcarbamoyl group, an N-2,4-bis(octyloxy)phenylcarbamoyl group, or a morpholinocarbamoyl group, a cyano group, a sulfonyl group such as a methane sulfonyl group, a benzene sulfonyl group, or a toluene sufonyl group, a phosphono group such as a diethylphosphono group, and a heterocyclic group such as a benzoxazole-2-yl group, a bezothiazole-2-yl group, a 3,4-dihydroquinazolin-4-on-2-yl group, and a 3,4-dihydroquinazoline-4-sulfone-2-yl group.

When $G^1$ and $G_2$ are combined with each other to form an aromatic ring as such aromatic rings, mentioned are benzenen naphthalene, anthracene, and the like.

When $G^1$ and $G^2$ are combined with each other to form a heterocyclic ring, as such a heterocyclic ring, mentioned is a 5-membered or 6-membered heterocyclic ring. Examples of such 5-membered or 6-membered heterocyclic rings formed by $G^1$ and $G^2$ include a thiazole nucleus (a thiazole nucleus (for example, thiazole, 4-methylthiazole 4-phenylthiazole, or 4,5-dichlorothiazole), a benzothiazole nucleus (for example, benzothiazole, 4-chlorobenzothiazole, 5-chlorobenzothiazole, 6-chlorobenzothiazole, 5-nitrobenzothiazole, 5-methylbenzothiazole, 5-phenylbenzothiazole, 5-ethoxybenzothiazole, 5-ethoxycarbonylbenzothiazole, 5-phenoxybenzothiazole, 5-fluorobenzothiazole, 5-trifluoromethylbenzothiazole. 5-chloro-6-methylbenzothiazole, tetrahydrobenzothiazole, 4-phenylbenzothiazole, or 5,6-bismethylbenzothiazole);

a naphthothiazole nucleus (for example, naphtho[2,1-d]thiazole, naphtho[1,2-d]thiazole, naphtho[2,3-d]thiazole, 5-methoxynaphtho[1,2-d]thiazole, 7-ethoxynaphtho[2,1-d]thiazole, 8-methoxynaphtho[2,1-d]thiazole, or 5-methoxynaphtho[2,3-d]thiazole), or 8-methylthionaphtho[2,1-d]thiazole), athiazoline nucleus (for example, thiazoline, 4-methylthiazoline, or 4-nitrothiazoline), an oxazole nucleus {an oxazole nucleus (for example, oxazole, 4-methyloxazole, 4-nitrooxazole, 4-phenyloxazole, 4,5-diphenyloxazole, or 4-ethyloxazole), a benzoxazole nucleus (for example, benzoxazole, or 5-chlorobenzoxazole, 5-methylbenzoxazole, 5-fluorobenzoxazole, 5-phenylbonzoxazole, 5-nitrobenzoxazole, 5-trifluoromethylbenzoxazole, or 5-acetylbenzoxazole), a naththooxazole nucleus (for example, naphtho[2,1-d]oxazole, naphtho[1,2-d]oxazole, naphtho[2,3-d]oxazole, or 5-nitronaphtho[2,1-d]oxazole)};

an oxazoline nucleus (for example, 4,4-dimethyloxazoline), a selenazole nucleus {a selenazole nucleus (for example, 4-methylselenazole, 4-nitroselenazole, or 4-phenylselenazole), a benzoselenazole nucleus (for example, benzoselenazole, 5-chlorobenzoselenazole, 5-nitrobenzoselenazole, 6-nitrobenzoselenazole, 5-chloro-6-nitrobenzoselenazole, or 5,6-dimethylbenzoselenazole), a naphthoselenazole nucleus (for example, naphtho[2,1-d]selenazole, or naphtho[1,2-d]selenazole)}, a selenazoline nucleus (for example, selenazoline, or 4-methylselenazoline), a tellurazole nucleus {a tellurazole nucleus (for example, tellurazole, 4-methyltellurazole, or 4-phenyltellurazole), a benzotellurazole nucleus (for example, benzotellurazole, 5-chlorobenzotellurazole, 5-methylbenzotellurazole, 5,6-dimethylbenzotellurazole, or 6-methoxybenzotellurazole), a naphthotellurazole nucleus (for example, naphtho[2,1-d]tellurazole, or naphtho[1,2-d]tellurazole)};

a tellurazoline nucleus (for example, tellurazoline, or 4-methyltellurazoline), a 3,3-dialkylindolenine nucleus (for example, 3,3-dimethylindolenine, 3,3-diethylindolenine, 3,3-dimethyl-5-cyanoindolenine, 3,3-dimethyl-6-nitroindolenine, 3,3-dimethyl-5-nitroindolenine, 3,3-dimethyl-5-methoxyindolenine, 3,3,5-trimethylindolenine, or 3,3-dimethyl-5-chloroindolenine);

an imidazole nucleus {an imidazole nucleus (for example, a 1-alkylimidazole, a 1-alkyl-4-phenylimidazole, or a 1-arylimidazole), a benzoimidazole nucleus (for example, a 1-alkylbenzoimidazole, a 1-alkyl-5-chlorobenzoimidazole, a 1-alkyl-5,6-dichlorobenzoimidazole, a 1-alkyl-5-cyanobenzoimidazole, a 1-alkyl-5-fluorobenzoimidazole, a 1-alkyl-5-trifluoromethylbenzoimidazole, a 1-alkyl-6-chloro-5-cyanobenzoimidazole, a 1-alkyl-6-chloro-5 trifluoromethylbenzoimidazole, a 1-aryl-5,6-dichlorobenzoimidazole, or a 1-arylbenzoimidazole), a naphthoimidazole nucleus (for example, a 1-alkylnaphtho[1,2-d]imidazole)}. Among examples of imidazole nuclei, as alkyl groups, an alkyl group having from 1 to 8 carbon atoms such as an unsubstituted alkyl group, for example, a methyl group, an ethyl group, a propyl group, an isopropyl group, or a butyl group, or a hydroxyalkyl group (for example, 2-hydroxyethyl, or 3-hydroxypropyl) is preferable and, above all, the methyl group and the ethyl group are particularly preferable. Among examples of imidazole nuclei, as aryl groups, for example, mentioned are a phenyl, a halogen (for example, chloro) substituted phehyl, an alkyl (for example, methyl) substituted phenyl, and alkoxy (for example, methoxy) substituted phenyl.

Further, examples of 5-membered or 6-membered heterocyclic nuclei formed by $G^1$ and $G^2$ preferably include a dithiol nucleus {a dithiol nucleus (for example, 1,3-dithiol, 4-chloro-1,3-dithiol, or 4,5-dialkoxycarbonyl-1,3-dithiol), a 4,5-benzo-1,3-dithol nucleus, or a 4,5-naphtho-1,3-dithiol nucleus}, a dithiolane nucleus (for example, 1,3-dithiolane, or 4-fluoro-1,3-dithiolane), a dioxol nucleus (for example, 1,3-dioxol, or 4-methyl-1,3-dioxol), a 4,5-benzo-1,3-dioxol nucleus, or a 4,5-naphtho-1,3-dioxol nucleus), a dioxolane nucleus (for example, 1,3-dioxolane, or 4-trifluoromethyl-1,3-dioxolane). Among examples of dithiol nuclei, as an alkoxycarbonyl group, an alkoxycarbonyl group having from 2 to 9 carbon atoms, for example, an alkoxycarbonyl group of methoxycarbonyl, ethoxycarbonyl, and buthoxycarbonyl.

Further, examples of the 5-membered or 6-membered heterocyclic nuclei formed by $G^1$ and $G^2$ include a pyridine nucleus (for example, 2-pyridine, 4-pyridine, 5-methyl-2-pyridine, or 3-methyl-4-pyridine), a quinoline nucleus {a quinoline nucleus (for example, 2-quinoline, 3-methyl-2-quinoline, 5-ethyl-2-quinoline, 6-methyl-2-quinoline, 6-nitro-2-quinoline, 8-fluoro-2-quinoline, 6-methoxy-2-quinoline, 6-hydroxy-2-quinoline, 8-chloro-2-quinoline, 4-quinoline, 6-ethoxy-4-quinoline, 6-nitro-4-quinoline, 8-chloro-4-quinoline, 8-fluoro-4-quinoline, 8-methyl-4-quinoline, 8-methoxy-4-quinoline, 6-methyl-4-quinoline, 6-methoxy-4-quinoline, 6-chloro-4-quinoline, or 5,6-dimethyl-4-quinoline), an isoquinoline nucleus (for example, 6-nitro-1-isoquinoline, 3,4-dihydro-1-isoquinoline, or 6-nitro-3-isoquinoline)}, an imidazo[4,5-b]quinoxaline nucleus (for example, 1,3-diethylimidazo[4,5-b]quinoxaline, a 6-chloro-1,3-diallylimidazo[4,5-b]quinoxaline, 6-chloro-1,3-dibenzylimidazo[4,5-b]quinoxaline, 6-chloro-1,3-diphenylimidazo[4,5-b]quinoxaline, or a 6-nitro-1,3-diallylimidazo[4,5-b]quinoxaline);

an oxadiazole nucleus, a thiadiazole nucleus, a pyrimidine nucleus, an imidazo[4,5-b]pyrazine nucleus (for example, 1,3-diethyl[4,5-b]pyrazine, or a 1,3-diallyl[4,5-b]pyrazine), an imidazo[4,5-b]1,4-quinone nucleus, a pyrrolopyridine nucleus, a pyrazolopyridine nucleus, 1,3,3a,7-tetraazaindene nucleus, an indolizine nucleus, 1,8-naphthyridine nucleus, a pyran nucleus (for example, α-pyran, γ-pyran, benzo-α-pyran, or benzo-γ-pyran), a thiapyran nucleus (for example, α-thiapyran, γ-thiapyran, benzo-α-thiapyran, or benzo-γ-thiapyran), and an indolenine nucleus;

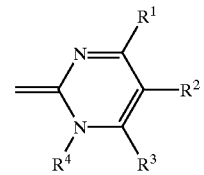

and the like.

In the above-described general formula (III), n denotes an integer of from 0 to 3.

In the above-described general formulas (I) and (III), $X^{-1}$ represents a group which is capable of forming an anion. Examples of such anions include, for example, a halogen ion (Cl', Br', or I'), a p-toluene sulfonic acid ion, an ethylsulfuric acid ion, a 1,5-disulfonaphthalene dianion, $PF_6'$, $BF_4'$, and $ClO_4'$, Further, $X^-$ may be a substituent which has substituted any substitutable position of a cation portion of the above-described general formula (I); on this occasion, respective compounds expressed by the above-described general formulas (I) and (III) may form inner salts.

Specific examples of compounds (illustrative compounds) expressed by the above-described general formulas (I) and (III) will be described, but the present invention is by no means limited to these examples.

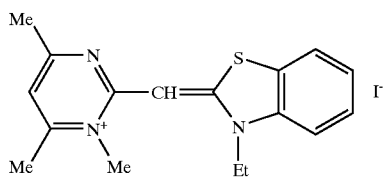

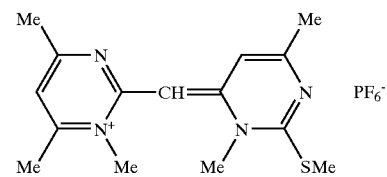

-continued
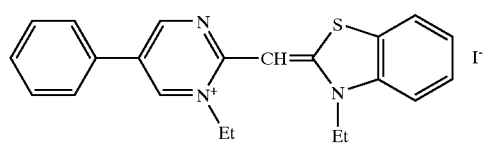
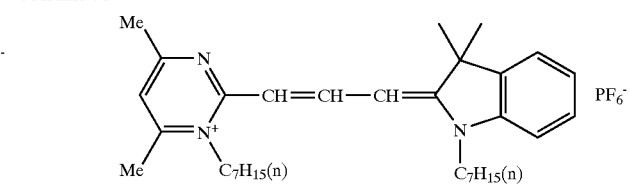
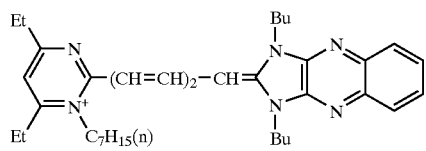
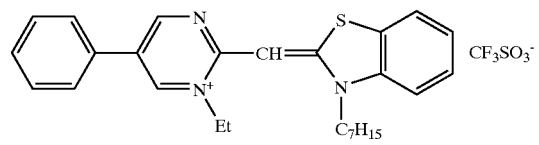
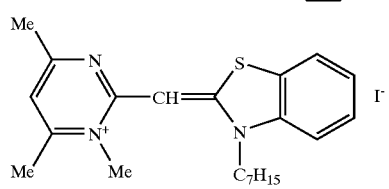
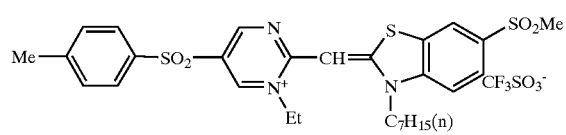
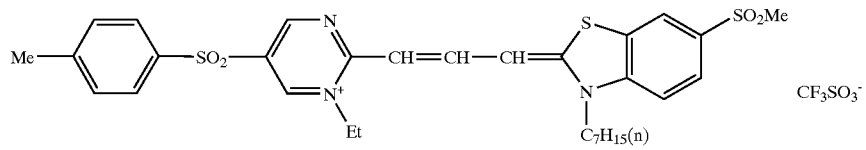
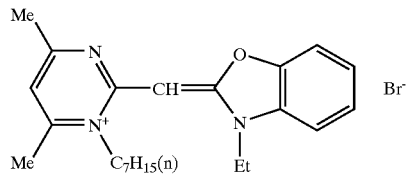
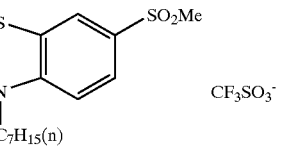
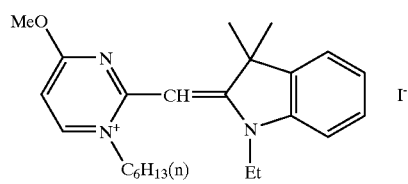
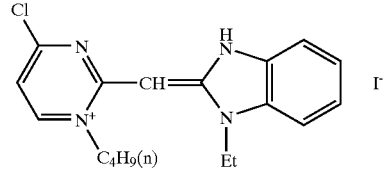
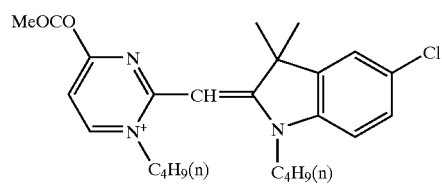
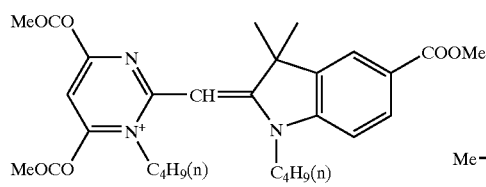
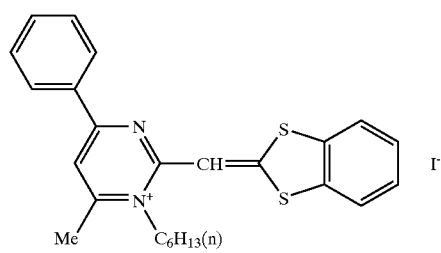
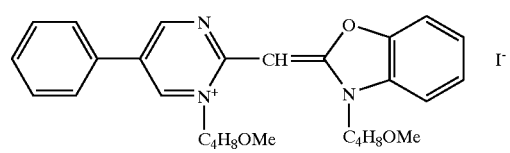

-continued
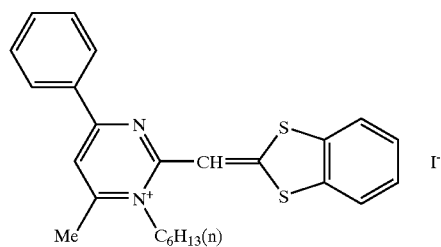
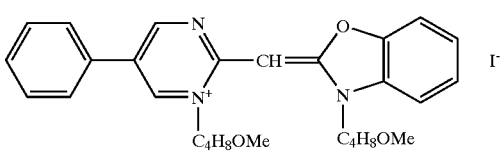
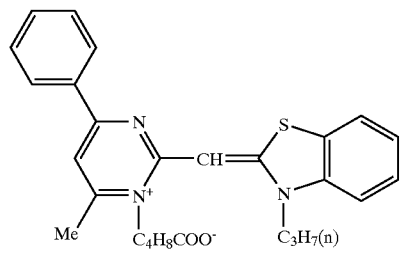
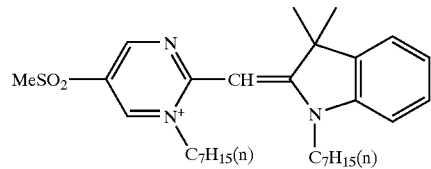
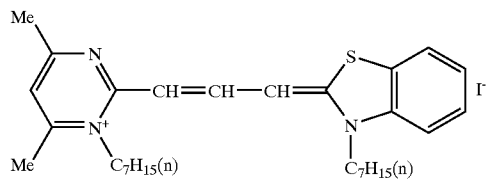
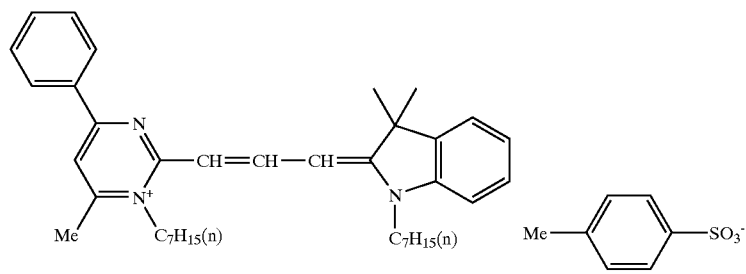
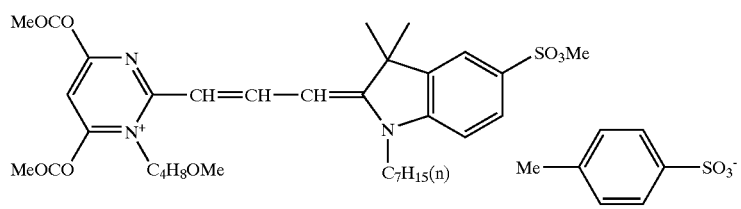
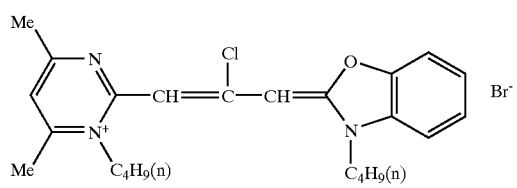
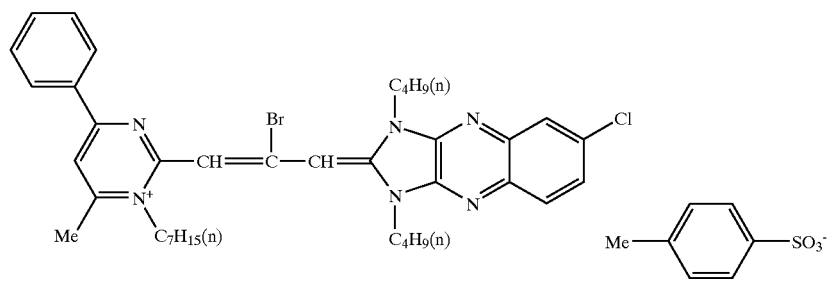

-continued

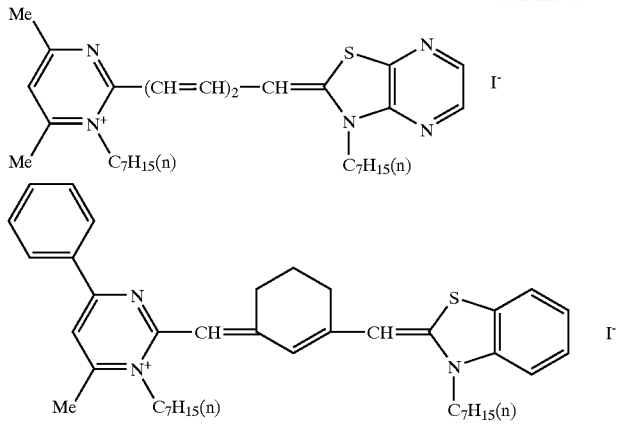

The compounds expressed by the above-described general formulas (I) and (III) may be used either each individually or in combination of two types or more.

A content of the compound expressed by any one of the above-described general formulas (I) and (III) in the photopolymerizable composition is preferably from 0.01 part by weight to 5 parts by weight, and more preferably from 0.05 part by weight to 2 parts by weight, based on 1 part by weight of a radical generating agent described later.

When the above-described content is less than 0.01 part by weight, there is a case in which photopolimerization sensitivity is deteriorated, whereas when it is more than 5 parts by weight, there is a case in which it requires a need for a prolonged period of time to decolor a dye.

By containing the compound expressed by any one of the above-described general formulas (I) and (III), it is possible to enhance photopolymerization sensitivity of the photopolymerizable composition whereupon it can be aimed for to intensify sensitivity to not only ultraviolet light but also light of from visible light to infrared light. Further, the compound expressed by any one of the above-described general formulas (I) and (III) shows a high decomposition performance by a radical to be generated by a radical generating agent and is excellent in a decoloration property whereby it can be sufficiently decolored without requiring a need for a prolonged period of time. Therefore, as described below, even when the compound is used in a recording material of completely dry processing system which does not use a developing liquid or the like, coloration of a non-image portion (base portion) of a formed image can be decreased to form a sharp image having a high contrast.

Radical Generating Agent

The photopolymerizable composition according to the present invention contains a radical generating agent which can generate a radical by interacting with the above-described spectral sensitizing dye. By allowing the radical generating agent to be present simultaneously with the above-described spectral sensitizing dye, the photopolymerizable composition responds to irradiation light having a spectral abosorption wavelength range thereof in a highly sensitive manner to generate radicals in a highly efficient manner whereupon the radical generating agent can aim for high sensitivity and control generation of the radical by using an optional light source in a range of light of from visible light to infrared light.

As for the above-described radical generating agents, at least one type can be selected from radical generating agents which can initiate polymerization of a polymerizable compound contained in the photopolymerizable composition to be used, Examples of the above-described radical generating agents include aromatic ketones, for example, benzophenone, camphorquinone, 4,4-bis (dimethyamino) benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone, bisacylphosphine oxides such as bis(2,4,6-trimethylbenzoyl)-phenylphosphine oxide, acylphosphine oxides such as Lucirin TPO, α-hydroxy- or α-amino-acetophenones, α-hydroxycycloalkylphenylketones, and dialkoxyacetophenones;

benzoin and benzoin ethers such as benzoin methyl ether, benzoin ethyl ether, benzoin isopropyl ether, and benzoin phenyl ether; 2,4,6-triarylimidazole dimers such as a 2-(o-chlorophenyl)-4,5-diphenylimidazole dimer, a 2-(o-chlorophenyl)-4,5-di(m-methoxyphenyl) imidazole dimer, a 2-(o-fluorophenyl)-4,5-diphenylimidazole dimer, a 2-(o-methoxyphenyl) -4,5-diphenylimidazole dimer, and a 2-(p-methoxyphenyl) -4,5-diphenylimidazole dimer; further, compounds described in U.S. Pat. Nos. 3,784,557, 4,252,887, 4,311,783, 4,459,349, 4,410,621, 4,622,286 and the like;

polyhalogen compounds such as carbon tetrabromide, phenyltribromomethylsulfon, and phenyltrichloromethyl ketone; compounds described in JP-A No. 59-133428, JP-B Nos. 57-1819 and 57-6096, and U.S. Pat. No. 3,615,455;

S-triazine derivatives having a trihalogen-substituted methyl group, which are described in JP-A No. 58-29803, such as 2,4,6-tris(trichloromethyl)-S-triazine, 2-methoxy-4,6-bis(trichloromethyl)-S-triazine, 2-amino-4,6-bis(trichloromethyl)-S-triazine, and 2-(P-methoxystyryl) -4,6-bis(trichloromethyl)-S-triazine;

organic peroxides, which are described in JP-A No. 59-189340, such as methyl ethyl ketone peroxide, cyclohexanone peroxide, 3,3,5-trimethylcyclohexanone peroxide, benzoyl peroxide, di-tert-butyldiperoxyisophthalate, 2,5-dimethyl -2,5-di (benzoylperoxy)hexane, tert-butyl peroxybenzoate, a,a'-bis(tert-butylperoxyisopropyl)benzene, dicumyl peroxide, and 3,3',4,4'-tetra-(tert-isobutylperoxycarbonyl)benzophenone;

an adinium salt described in U.S. Pat. No. 4,743,530; an organic boron compound; phenyl glyoxalic acid esters such as phenyl glyoxalic acid methyl ester; titanocenes such as bis($\eta^5$-2,4-cyclopentadiene-1-yl)-bis(2,6-difluoro-3-(1H-pyrrole -1-yl)-phenyl)titanium; iron allene complexes such as $\eta^5$-cyclopentadienyl-$\eta^6$-cumenyl-iron(1+)-hexafluorophosphate (1−); diarylidonium salts such as a diphenyl iodonium salt; triarylsulfonium salts such as a triphenyl sulfonium salt.

More detailed examples of compounds of the above-described described radical generating agents and examples of other types of radical generating agents include compounds described in paragraphs of from 0067 to 0132 of JP-A No. 10-45816.

Further, as the above-described radical generating agent, a material comprising a combination of two types or more of compounds can also be used. For example, a combination of a 2,4,5-triarylimidazole dimer and mercaptobenzoxazole and the like, a combination, which is described in U.S. Pat. No. 3,427,161, of 4,4'-bis(dimethylamino)benzophenone, benzophenone and benzoin methyl ether, a combination, which is described in U.S. Pat. No. 4,239,850, of benzoyl-N-methylnaphthothiazoline and 2,4-bis(trichloromethyl)-6-(4'-methoxyphenyl)-triazole, a combination, which is described in JP-A No. 57-23602, of dialkylaminobenzoic acid ester and dimethylthioxanthone, a combination, which is described in JP-A No. 59-78339, of three types, namely, 4,4'-bis(dimethylamino)benzophenone, benzophenone and a polyhalogenated methyl compound.

When the radical generating agent comprises a combination of two types or more, a combination of 4,4'-bis(diethylamino)benzophenone and benzophenone, a combination of 2,4-diethylthioxanthone and 4-dimethylaminobenzoic acid ethyl, or a combination of 4,4'-bis(diethylamino)benzophenone and a 2,4,5-triarylimidazole dimer is preferably used.

Organic Boron Compound

Among the above-described radical generating agents, in view of capability of interacting with a dye in an exposure range to effectively generate the radical thereby enhancing the sensitivity, the organic boron compound, the diaryl iodonium salts, the iron allene complexes, the S-triazine derivative having the trihalogen-substituted methyl group, the organic peroxide, titanocene, the 2,4,5-triarylimidazole dimer, and the adinium salt compound are preferable, and, among other things, the organic boron compound is particularly preferable. The above-described organic boron compound is preferable from the point that, even when a spectral sensitizing dye is used as a spectral sensitizing compound, the spectral sensitizing dye which is simultaneously present at the time of irradiating light for fixing an image can be decolored. Further, the above-described organic boron compound may simultaneously use the above-described radical generating agent.

As the organic boron compound according to the present invention, mentioned are a compound expressed by the general formula (II) to be described below, and a spectral sensitizing dye type organic boron compound which has the cationic dye described in pp. 393–416 of "Chemistry of Functional Dyes" (CMC Press, 1981) or pp. 212–224 of "Color Material" 60[4] 1987 and the like as a cationic part in a structure thereof. As for this spectral sensitizing agent type organic boron compound, mentioned are compounds described in JP-A Nos. 62-143044, 1-138204, JP-W No. 6-505287, JP-A No. 4-261406 and the like.

As a dye which constitutes the cationic portion of the above-described spectral sensitizing dye type organic boron compound, a cationic dye having a maximum absorption wavelength in a wavelength range of 300 nm or more, preferably from 400 nm to 1100 nm can be used. Among other things, a methine dye, a polymethine dye, a triaryl methane dye, an indoline dye, an azine dye, a xanthene dye, a cyanine dye, a hemicyanine dye, a rhodamine dye, an azomethine dye, an oxazine dye, an acridine dye and the like, all of which are of a cationic type, are preferable, and, particularly, the cyanine dye, the hemicyanine dye, the rhodamine dye and the azomethine dye, all of which are of the cationic type, are more preferable.

Among the above-described organic boron compounds, a compound expressed by the following general formula (II) is preferable, since it can respond to not only ultraviolet light but also light of from visible light to infrared light in a high sensitive manner:

General Formula (II)

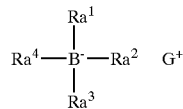

wherein $R_a^1$, $R_a^2$, $R_a^3$, and $R_a^4$ each individually represent an aliphatic group, an aromatic group, a heterocyclic group, or $Si(R_a^5)(R_a^6)-R_a^7$.

In a case in which $R_a^1$ to $R_a^4$ each individually represent an aliphatic group, examples of such aliphatic groups include an alkyl group, a substituted alkyl group, an alkenyl group, a substituted alkenyl group, an alkynyl group, a substituted alkynyl group, an aralkyl group, and a substituted aralkyl group. Among these groups, the alkyl group, the substituted alkyl group, the alkenyl group, the substituted alkenyl group, the aralkyl group, and the substituted aralkyl group are preferable, and, above all, the alkyl group and the substituted alkyl group are particularly preferable.

Further, the above-described aliphatic groups may either be a cyclic aliphatic group or a chain aliphatic group; on this occasion, the chain aliphatic group may have a branched chain.

The above-described alkyl groups may be of any one of straight-chain, branched-chain, and cyclic types. A number of carbon atoms thereof is preferably from 1 to 30, and more preferably from 1 to 20. These alkyl groups may either be substituted or unsubstituted; on this occasion, a preferable range of a number of carbon atoms of an alkyl portion of the substituted alkyl group is same as in the alkyl group.

Examples of the above-described alkyl groups include a methyl group, an ethyl group, a propyl group, a butyl group, a pentyl group, a hexyl group, a cyclopentyl group, a neopentyl group, an isopropyl group, an isobutyl group, a cyclohexyl group, an octyl group, a 2-ethylhexyl group, a decyl group, a dodecyl group, and an octadecyl group.

Examples of substituents of the above-described substituted alkyl groups include a carboxyl group, a sulfo group, a cyano group, a halogen atom (for example, a fluorine atom, a chlorine atom, or a bromine atom), a hydroxy group, an alkoxycarbonyl group having 30 carbon atoms or less (for example, a methoxycarbonyl group, an ethoxycarbonyl group, or a benzyloxycarbonyl group), an alkylsulfonylaminocarbonyl group having 30 carbon atoms or less, an arylsulfonylaminocarbonyl group, an alkylsulfonyl group, an arylsulfonyl group, an acylaminosulfonyl group having 30 carbon atoms or less, an alkoxy group having 30 carbon atoms or less (for example, a methoxy group, an ethoxy group, a benzyloxy group, or a phenethyloxy group), an alkylthio group having 30 carbon atoms or less (for example, a methylthio group, an ethylthio group, or a methylthioethylthioethyl group), an aryloxy group having 30 carbon atoms or less (for example, a phenoxy group, a p-tolyloxy group, a 1-naphthoxy group, a or 2-naphthoxy group), a nitro group, an alkyl group having 30 carbon atoms or less, an alkoxycarbonyloxy group, an aryloxycarbonyloxy group;

an acyloxy group having 30 carbon atoms or less (for example, an acetyloxy group, or a propionyloxy group), an acyl group having 30 carbon atoms or less (for example, an acetyl group, a propionyl group, or a benzoyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group having 30 carbon atoms or less (for example, a phenyl group, a 4-chlorophenyl group, a 4-methylphenyl group, or an α-naphthyl group), a substituted amino group (for example, an amino group, an alkylamino group, a dialkylamino group, an arylamino group, a diarylamino group, or an acylamino group), a substituted ureide group, a substituted phosphono group, a heterocyclic group or the like. Among above-described groups, the carboxyl group, the sulfo group, the hydroxy group and the phosphono group may each be in a salt state. On this occasion, a cation for use in forming such a salt includes G+ or the like which will be described below.

As the above-described alkenyl groups, any one of straight-chain, branched-chain and cyclic types is permissible. A number of carbon atoms thereof is preferably from 2 to 30, and more preferably from 2 to 20. Further, the above-described alkenyl group may either be substituted or unsubstituted; on this occasion, a preferable range of a number of carbon atoms of an alkenyl portion of the substituted alkenyl group is same as in the alkenyl group.

As substituents of the above-described substituted alkenyl groups, mentioned are same substituents as in the above-described substituted alkyl groups.

As the above-described alkynyl groups, any one of straight-chain, branched-chain and cyclic types is permissible. A number of carbon atoms thereof is preferably from 2 to 30, and more preferably from 2 to 20. Further, the above-described alkynyl group may either be substituted or unsubstituted; on this occasion, a preferable range of a number of carbon atoms of an alkynyl portion of the substituted alkynyl group is same as in the alkynyl group.

As substituents of the substituted alkynyl groups, mentioned are same substituents as in the above-described substituted alkyl groups.

As the above-described aralkyl groups, any one of straight-chain, branched-chain and cyclic types is permissible. A number of carbon atoms thereof is preferably from 7 to 35, and more preferably from 7 to 25. Further, the above-described aralkyl group may either be substituted or unsubstituted; on this occasion, a preferable range of a number of carbon atoms of an aralkyl portion of the substituted aralkyl group is same as in the aralkyl group.

As substituents of the substituted aralkyl groups, mentioned are same substituents as in the above-described substituted alkyl groups.

When the above-described $R_a^1$ to $R_a^4$ each individually represent an aromatic group or an alkyl group, mentioned are, for example, an aryl group and a substituted aryl group as the above-described aromatic substituents. A number of carbon atoms of the aryl group is preferably from 6 to 30, and more preferably from 6 to 20. A preferable range of a number of carbon atoms of an aryl part of the substituted aryl group is same as in the aryl group. Examples of the above-described aryl groups include a phenyl group, an α-naphthyl group, and a β-naphthyl group.

As substituents of the substituted aryl groups, mentioned are same substituents as in the above-described substituted alkyl groups.

When the above-described $R_a^1$ to $R_a^4$ each individually represent a heterocyclic group, mentioned are the heterocyclic group having a substituent and an unsubstituted heterocyclic group as the above-described heterocyclic group. As the substituent of the heterocyclic group having the substituent, mentioned are same substituents as those exemplified in a case in which $R^1$ to $R^4$ each represent the substituted aryl group.

Among them, as the heterocyclic group which $R_a^1$ to $R_a^4$ each represent, the heterocyclic group having a nitrogen atom, a sulfur atom or an oxygen atom, such as a furan ring, a pyrrole ring, an imidazole ring, an oxazole ring, a thiazole ring, or a pyridine ring is preferable.

When $R_a^1$ to $R_a^4$ each individually represent —Si($R_a^5$)($R_a^6$)—$R_a^7$, $R_a^5$, $R_a^6$, and $R_a^7$ each individually represent an aliphatic group, or an aromatic group. The above-described aliphatic, or aromatic group signifies same aliphatic or aromatic group as that which $R_a^1$ to $R_a^4$ each represent. The same can be said with a preferable example.

In the above-described general formula (II), at least two of $R_a^1$, $R_a^2$, $R_a^3$, and $R_a^4$ may connect with each other either directly or via a substituent to form a ring. When the ring is formed, any one selected from the rings consisting of (C1) to (C3) described below is preferable as the above-described ring and, among other things, the ring of (C2) is particularly preferable.

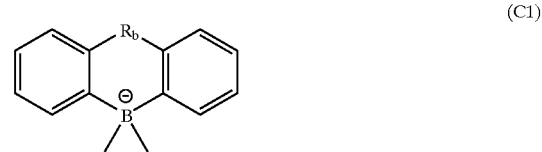

(C1)

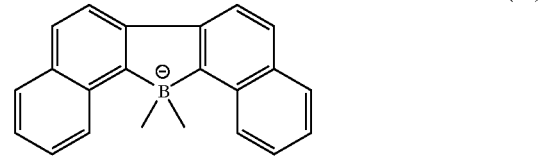

(C2)

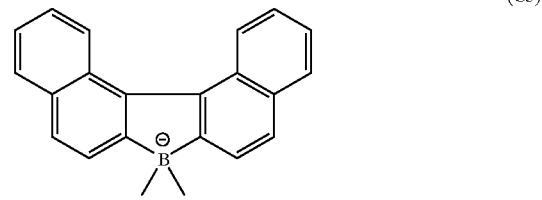

(C3)

In the ring of the above-described (C1), $R_b$ represents any one of divalent groups described below.

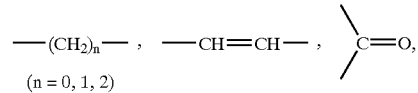

-continued

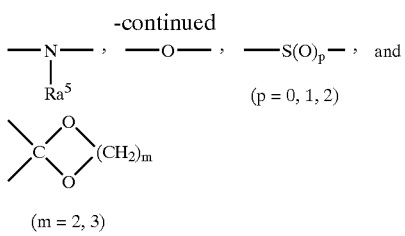

(wherein Ra⁵ represents H or a monovalent substituent.)

It is preferable that, among the organic boron compounds expressed by the above-described general formula (II), at least one of $R_a^1$ to $R_a^4$ is an alkyl group. Further, it is more preferable that, in view of intensifying sensitivity and enhancing storage stability, one of $R_a^1$ to $R_a^4$ is the alkyl group and the remaining three thereof are the organic boron compounds of triarylalkyl types which are aryl groups.

Particularly, the organic boron compound of the triarylalkyl type in which an aryl group is substituted with an electron attractive group is preferable; among other things, the organic boron compound in which a sum of Hammet (σ) values of substituents (electron attractive groups) on three aryl groups is in a range of from +0.36 to +2.58 is more preferable.

As for the above-described electron attractive groups, a halogen atom and a trifluoromethyl group are preferable and, particularly, a fluorine atom and a chlorine atom are more preferable.

Examples of the aryl groups substituted with the electron attractive group include a 3-fluorophenyl group, a 4-fluorophenyl group, a 2-fluorophenyl group, a 3-chlorophenyl group, a 4-chlorophenyl group, a 3-trifluoromethylphenyl group, a 4-trifluoromethylphenyl group, a 3,5-difluorophenyl group, a 4-bromophenyl group, a 3,4-difluorophenyl group, a 5-fluoro-2-methylphenyl group, a 5-fluoro-4-methylphenyl group, a 5-chloro-2-methylphenyl group, and a 5-chloro-4-methylphenyl group.

Examples of the anionic portion of the above-described general formula (II) include tetramethyl borate, tetraethyl borate, tetrabutyl borate, triisobutyl methyl borate, di-n-butyl-di-t-butylborate, tri-m-chlorophenyl-n-hexylborate, triphenyl methyl borate, triphenyl ethyl borate, triphenyl propyl borate, triphenyl-n-butyl borate, trimesityl butyl borate, tritolyl isopropyl borate, triphenyl benzyl borate, tetra-m-fluorobenzyl borate, triphenyl phenethyl borate, triphenyl-p-chlorobenzyl borate, triphenylethenyl butyl borate, di(α-naphthyl)-dipropyl borate, triphenylsilyl triphenyl borate, tritoluylsilyl triphenyl borate, tri-n-butyl (dimethyphenylsilyl)borate, diphenyl dihexyl borate, tri-m-fluorophenyl hexyl borate, tri(5-chloro-4-methyphenyl) hexyl borate, tri-m-fluorophenyl cyclohexyl borate, and tri-(5-fluoro-2-methylphenyl)hexyl borate, In the above-described general formula (II), G⁺ represents groups capable of forming a cation. Among the groups, an organic cation type compound, a transition metal-coordinated complex cation (compound described in Japanese Patent No. 2791143 and the like), and a metallic cation (for example, Na⁺, K⁺, Li⁺, Ag⁺, Fe²⁺, Fe³⁺, Cu⁺, Cu²⁺, Zn²⁺, Al³⁺, or ½Ca²⁺) are preferable.

Examples of the above-described organic cation type compounds include a quaternary ammonium cation, a quaternary pyridinium cation, a quaternary quinolinium cation, a phosphonium cation, an iodonium cation, a sulfonium cation, and a dye cation.

Examples of the above-described quaternary ammonium cations include a tetralkylammonium cation (for example, a tetramethylammonium cation, or a tetrabutylammonium cation), and a tetrarylammonium cation (for example, a tetraphenylammonium cation). Examples of the above-described quaternary pyridiniumammonium cations include an N-alkylpyridinium cation (for example, an N-methylpyridinium cation), an N-arylpyridinium cation (for example, an N-phenylpyridinium cation), an N-alkoxypyridinium cation (for example, a 4-phenyl-N-methoxy-pyridinium cation), and an N-benzoylpyridinium cation. Examples of the above-described quaternary quinolinium cations include an N-alkylquinolinium cation (for example, an N-methylquinolinium cation), and an N-arylquinolinium cation (for example, an N-phenylquinolinium cation). Example of the above-described phosphonium cations includes a tetrarylphosphonium cation (for example, a tetraphenylphosphonium cation). Example of the above-described iodonium cations includes a diaryliodonium cation (for example, a diphenyliodonium cation). Example of the above-described sulfonium cations includes a triarylsulfonium cation (for example, a triphenylsulfonium cation).

Further, specific example of the above-described G⁺ includes a compound described in paragraphs of from 0020 to 0038 of JP-A No. 9-188686.

In each of the above-described cationic compounds (examplified compounds), as the alkyl group thereof, an alkyl group having carbon atoms of from 1 to 30 is preferably; for example, an unsubstituted alkyl group such as a methyl group, an ethyl group, a propyl group, an isopropyl group, a butyl group, or a hexyl group or the substituted alkyl group represented by $R_a^1$ to $R_a^4$ is preferable. Among other things, an alkyl group having carbon atoms of from 1 to 12 is particularly preferable.

Further, in each of the above-described cationic compounds, as the aryl group thereof, for example, a phenyl group, a halogen atom (for example, chlorine atom)-substituted phenyl group, an alkyl (for example, methyl group)-substituted phenyl group, and an alkoxy (for example, methoxy group)-substituted phenyl group are preferable.

Specific examples of the organic boron compound expressed by the above-described general formula (II) include compounds described in U.S. Pat. Nos. 3,567,453 and 4,343,891, JP-A Nos. 62-143044, 62-150242, 9-188684, 9-188685, 9-188686, and 9-188710, JP-B No. 8-9643, and JP-A No. 11-269210, and such compounds as illustrated below. However, the above-described organic boron compound according to the present invention is not limited thereto. The organic boron compound may simultaneously be used with a radical generating agent to be described below.

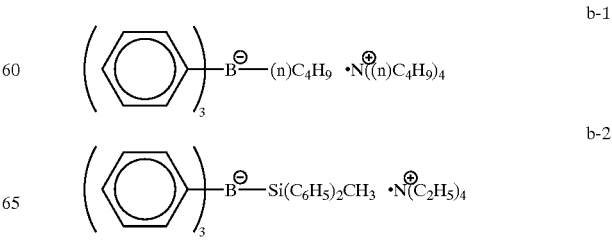

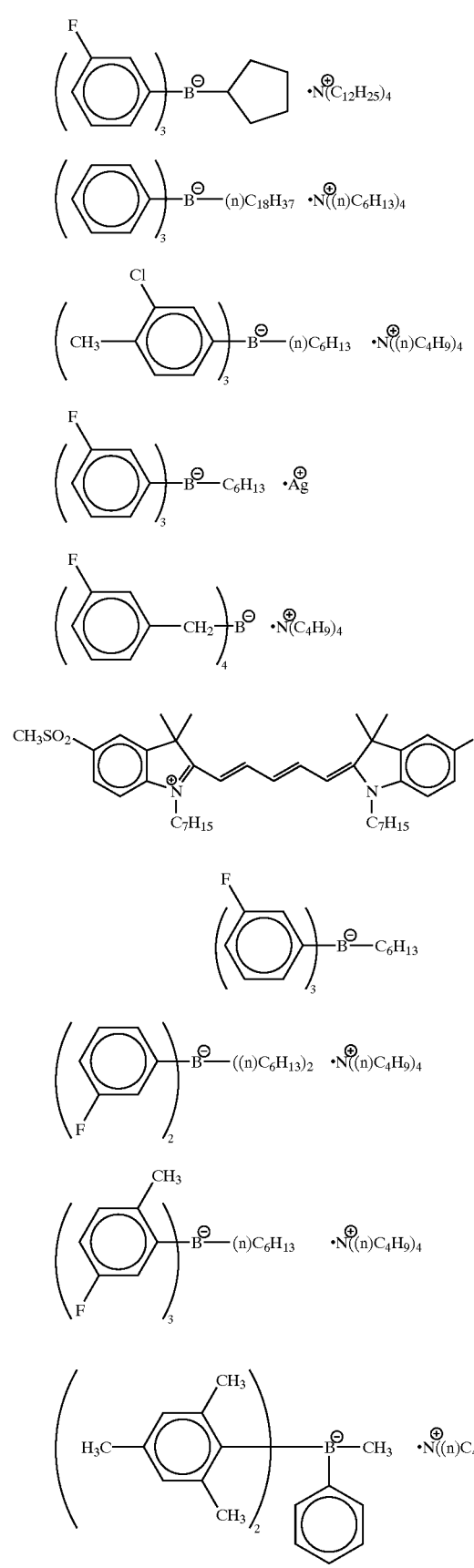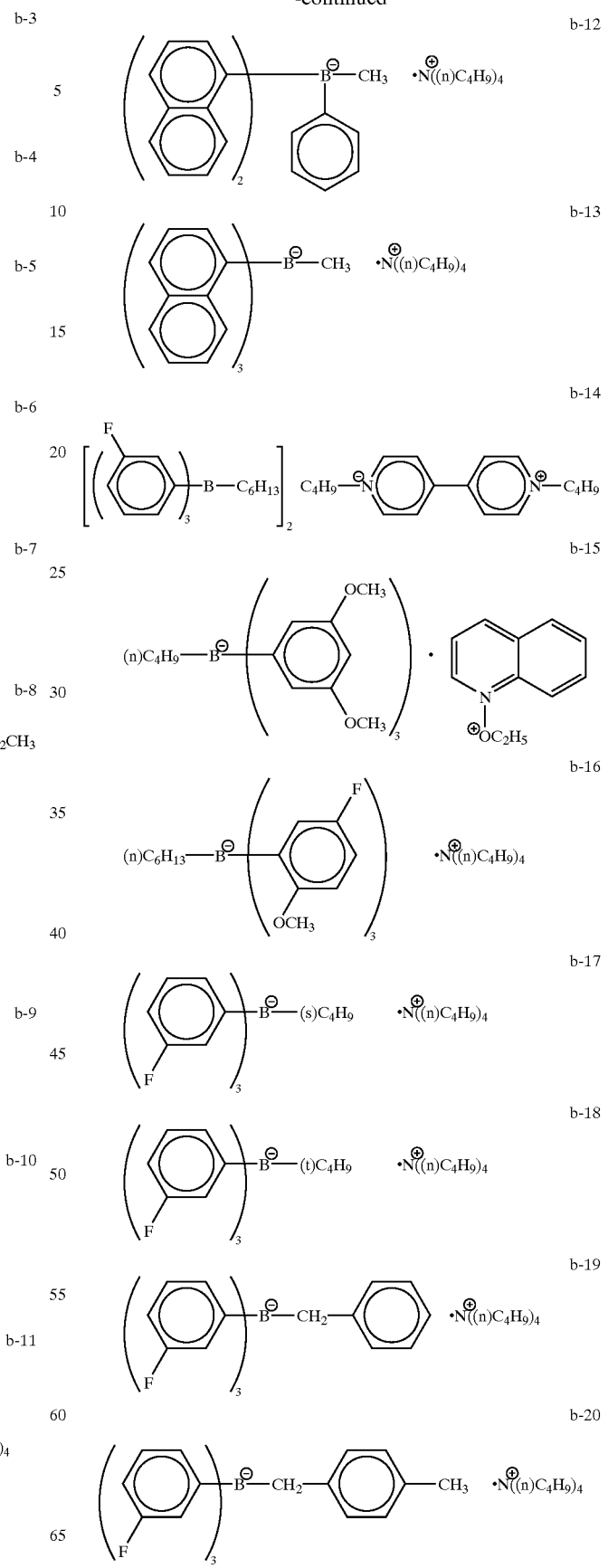

-continued

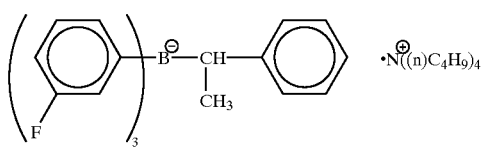
b-21

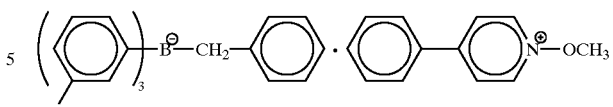
b-30

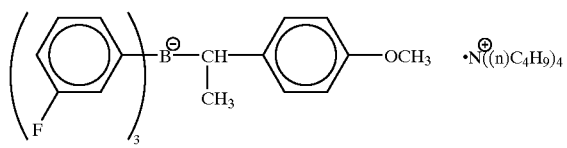
b-22

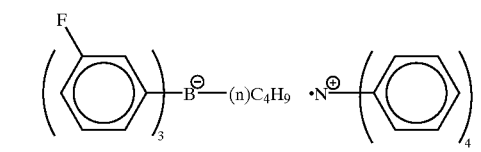
b-31

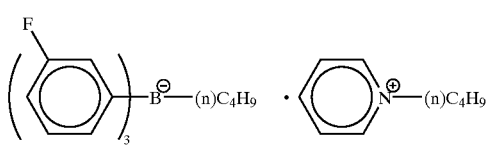
b-23 b-32

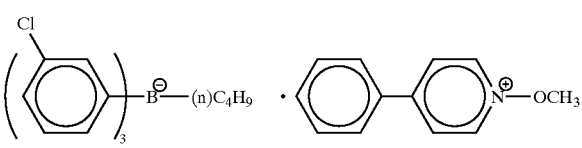
b-24 b-33

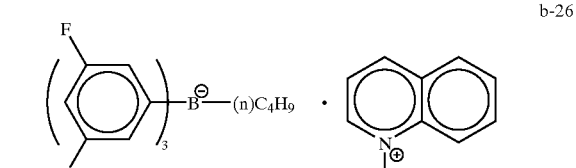
b-25

In the photopolymerizable composition, a content of the radical generating agent is preferably from 0.01% by weight to 20% by weight, and more preferably from 0.1% by weight to 10% by weight, based on a total weight of the polymerizable compound having the above-described ethylenically unsaturated bond. However, since such a preferable range as described above changes in accordance with a type of a concurrently employed "polymerizable compound having an ethylenically unsaturated bond", the present invention is not limited thereto, Other Components The photopolymerizable composition according to the present invention may contain a known additive or the like appropriately selected as another component in accordance with objects, so long as such a known additive or the like does not deteriorate an effect.

Examples of the above-described other components include a photopolymerization initiator, an oxygen scavenger, a thermal polymerization inhibitor, an ultraviolet ray absorber, a fluorescent dye, a chain transfer agent, and an antioxidant, and further, precursors thereof; on this occasion, any one of these components is added in a range of preferably from 0.01% by weight to 20% by weight, more preferably from 0.2% by weight to 15% by weight, and particularly preferably from 0.5% by weight to 10% by weight, based on a total weight of the photopolymerizable composition.

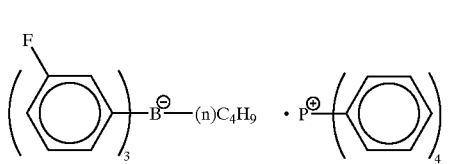
b-26

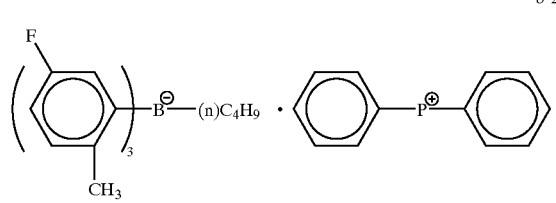
b-27

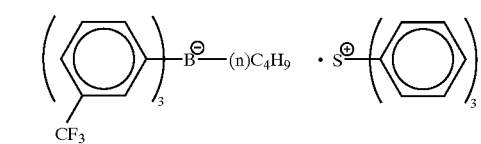
b-28

b-29

Specific examples of additives such as the above-described chain transfer agents, and antioxidants include compounds described in paragraphs of from 0135 to 0141 of JP-A No. 10-45816, in paragraphs of from 0087 to 0096 of JP-A No. 9-188686, in paragraphs of from 0079 to 0118 of JP-A No. 10-182621, in paragraphs of from 0080 to 0089 of JP-A No. 9-95487 and, further, compounds described in JP-A Nos. 1-13140, 1-13141, 1-13143, 1-13144, 1-17048, 1-229003, 1-298348, 10-138638, 11-269210, 2-187762 and the like.

The photopolymerizable composition according to the present invention may contain a binder, which is particularly favorable when the photopolymerizable composition is a liquid or a sticky substance.

A content of the above-described binder is preferably from 5% by weight to 95% by weight, more preferably from 10% by weight to 90% by weight, and most preferably from 15% by weight to 85% by weight, based on the total solid content.

The above-described binder can be selected depending on fields to be applied and characteristics necessary for the respective fields, such as imparting a developing ability in an aqueous system or an organic solvent system, adhesiveness to a substrate, and sensitivity to oxygen.

As the above-described binder, a polymer having a molecular weight of from about 5000 to about 2000000, and preferably from 10000 to 1000000 is desirable. Examples of such polymers as described above include a homopolymer or copolymer of acrylate or methacylate (for example, a copolymer of methyl methacrylate/ethyl acrylate/methacrylic acid, poly(alkyl methacrylate), or poly(alkyl acrylate)), a cellulose ester or a cellulose ether (for example, cellulose acetate, cellulose acetobutyrate, methyl cellulose, or ethyl cellulose), polyvinyl butyral, polyvinyl formal, cyclic rubber, a polyether (for example, polyethylene oxide, polypropylene oxide, or polytetrahydrofuran), polystyrene, polycarbonate, polyurethane, chlorinated polyolefin, polyvinyl chloride, a vinyl chloride/vinylidene chloride copolymer, a copolymer of vinylidene chloride and acrylonitrile, methyl methacrylate, vinyl acetate, polyvinyl acetate, a copolymer of ethylene and vinyl acetate, polycaprolactam, poly(hexamethylene adipamide), a polyester (for example, poly(ethylene glycol terephthalate), poly (hexamethylene glycol succinate)), a polyamide, and polyurea.

As examples thereof, further mentioned are water-soluble polymer compounds such as various types of gelatin, (modified) polyvinyl alcohol, polyvinyl pyrrolidone, a hydrolysate of a styrene-maleic acid copolymer, sodium polystyrene sulfonate, and sodium alginate. Furthermore, latices such as styrene-butadiene rubber latex, acrylonitrile-butadiene rubber latex, and methyl acrylate-butadiene rubber latex may be used.

An unsaturated compound can also be used as a mixture thereof with a non-photopolymerizable film forming component; it is, for example, a physically dried polymer or a polymer solution in an organic solvent, that is, for example, nitrocellulose or cellulose acetobutylate. However, such an unsaturated compound may also be a chemically and/or thermally curable (thermosetting) resin, for example, polyisocyanate, polyepoxide, a melamine resin, or a polyimide precursor. Further, simultaneous employment of the thermosetting resin is important from the reason that it can be used in a system well known in the art as a hybrid system in which a photopolymerization is performed at a first step and, then, cross-linking is executed by a thermal post-treatment at a second step.

Further, a binder having a polymerizable group can also be used.

Furthermore, as an example of another additive, mentioned is a compound described in JP-A No. 11-269210.

As for a light source to be used when an exposure is performed imagewise, an appropriate light source can be selected from known light sources having a light source wavelength in from a visible range to an infrared range and, among other things, a light source having a maximum absorption wavelength of from 300 to 1000 nm is preferable whereupon, in view of allowing an apparatus to be of a conveniently small size and low in cost, a (semiconductor) laser light source of blue-color, green-color, red-color or an LED is more preferable. Further, in order to obtain higher sensitivity, it is preferable that a light source which has a wavelength adapted to an absorption wavelength of a light absorption material such as a spectral sensitizing dye is appropriately selected.

On the other hand, as a light souce which is capable of being used at the time of decoloring the above-described photopolymerizable composition and a recording material to be described below, a light source which has a wavelength adapted to an absorption wavelength of the photopolymerizable composition is more preferable. Specifically, a wide range of light sources such as a mercury lamp, an ultra-high pressure mercury lamp, an electrodeless discharge mercury lamp, a xenon lamp, a tungsten lamp, a metal halide lamp, a (semiconductor) laser light source, an LED, and a fluorescent lamp are favorably mentioned.

As described above, by using a compound expressed by the above-described general formulas (I) and (II) as a spectral sensitizing dye, an image can be formed in a high sensitive manner even when not only ultraviolet light but also light of from visible light to infrared light are each individually used and, further, the above-described compound itself is excellent in decoloration whereupon an image without having a remained color caused by a color component can be obtained.

Recording Material

The recording material according to the present invention comprises a recording layer on a support, wherein the above-described recording layer comprises at least a color forming component A, a color forming component B having a portion which forms color by reacting with the above-described color forming component A and the photopolymerizable composition according to the present invention which has been already described, and further may optionally comprise an underlying layer, an intermediate layer, a light absorbing layer, a protective layer, a back-coating layer and other layers.

A basic constitutional aspect of the recording material according to the present invention is not particularly limited but can appropriately be determined in accordance with objects.

As a basic aspect, shown below is an example of image forming in a case in which, for example, the recording material according to the present invention is adopted to a positive-type photosensitive thermal recording material in which the color forming component A is enclosed in a thermally responsible microcapsule.

Namely, in the positive-type photosensitive thermal recording material of this aspect, when light is incident thereto imagewise, not only a radical is generated from a radical generating agent contained in the photopolymerizable composition in a light-irradiated portion but also a polymerization reaction of the above-described polymerizable compound is initiated and cured whereupon the photopolymerizable composition is fixed at a place where it is present to form a latent image. The above-described microcapsule is non-material-permeable at room temperature and, on this occasion, the color forming component A enclosed in the microcapsule and the color forming component B having a portion which forms color by reacting with the above, described color forming component A in a molecule are not contacted with each other and, accordingly, the positive-type photosensitive thermal recording material of this aspect is not in a state in which color is formed.

Thereafter, when heat is applied to the whole area of the photosensitive thermal recording material, the microcapsule is shifted to be material permeable, the color forming component B in a non-light irradiated portion is penetrated into the microcapsule (and/or the color forming component A is released into outside the microcapsule) whereupon the color forming components A and B are reacted with each other to form color only in a non-light exposed portion. On the other hand, in the light exposed portion, since the photopolymerizable composition is subjected to a polymerization reaction and is in a state that it is cured and set, the color forming components A and B are both immobilized and can not be contacted with each other whereupon no color is formed in the light exposed portion. Thereafter, by further exposing the whole area of the above-described photosensitive thermal recording material to light, a region which has not been polymerized is also polymerized (fixed) and the dye component contained in the photopolymerizable composition can also be decolored.

Further, the recording material according to the present invention maybe recording materials of aspects (a first aspect and a second aspect) to be described below and the image forming method thereof can be appropriately selected in accordance with respective aspects.

Namely, the recording material according to the first aspect is an aspect in which at least one of polymerizable compounds contained in the photopolymerizable composition is the above-described color forming component B itself and, on this occasion, a recording layer comprises at least the color forming component A and the photopolymerizable composition according to the present invention containing the color forming component B which allows the above-described color forming component A to form color.

Take, for example, a case of the above-described positive-type photosensitive thermal recording material of the basic aspect. The color forming component B has, as has already been described, a portion which allows the color forming component A to form color as well at an ethylenically unsaturated bond and, when the recording material is exposed to light imagewise, the above-described color forming component B initiates a polymerization reaction and is subsequently cured whereupon it is fixed at the spot to form a latent image. Therefore, in the light-exposed portion thereof, the color forming component B is immobilized whereupon it can not be contacted with the color forming component A; hence, color is not formed in the light-exposed portion.

The recording material according to the second aspect of the present invention comprises at least the color forming component A, the color forming component B which allows the above-described color forming component A to form color by reacting therewith and the above-described photopolymerizable composition according to the present invention, and is an aspect in which a polymerizable compound having an ethylenically unsaturated bond (hereinafter referred to also as "polymerizable compound" in short) contained in the above-described photopolymerizable composition is a color-forming suppressing compound which has the above-described color forming component A and a portion to suppress a reaction with the color forming component B (hereinafter referred to also as "reaction suppressing portion) in a same molecule.

The recording material according to the second aspect is described below by taking, for example, image forming in a case in which the recording material according to the second aspect is applied to the negative-type photosensitive thermal recording material in which the color forming component A is enclosed in a thermally responsive microcapsule.

In the negative-type photosensitive thermal recording material according to the present aspect, a microcapsule is non-material-permeable at room temperature in a same manner as in the above-described first aspect whereupon the color forming components A and B are not contcted with each other and, therefore, the recording material is in a state in which color is not formed. When this photosensitive thermal recording material is irradiated by light imagewise, the polymerizable compound present in the light-irradiated portion initiates a polymerization reaction and is cured whereupon the compound is fixed at the spot to form a latent image. Thereafter, when heat is applied to the whole area of the photosensitive thermal recording material, the microcapsule is shifted to be material permeable, the color forming component B in a non-light irradiated portion is penetrated into the microcapsule (and/or the color forming component A is released into outside the microcapsule) and, at the same time, the polymerizable compound in the non-light irradiated portion is penetrated into the microcapsule as a color-forming suppressing compound to suppress a color-forming reaction between the color forming components A and B. Therefore, a state in which color is not formed is maintained in the non-light irradiated portion. On the other hand, since the polymerizable compound (color-forming suppressing compound) in the light-irradiated portion is fixed by the polymerization reaction at the spot, a color forming reation proceeds without being involved in a reaction between the color forming components A and B whereupn color is formed only in the light-irradiated portion. Thereafter, by exposing the whole area of the above-described photosensitive thermal recording material to light, the dye contained in the photopolymerizable composition can be decolred.

As light sources for use in image forming by the recording material according to the present invention, usable are same light sources as those which are usable for exposing the above-described photopolymerizable composition according to the present invention.

Constitutional components to be used in the recording material according to the present invention will be described below.

Photopolymerizable Composition

The above-described photopolymerizable composition comprises 1) a polymerizable compound having an ethylenically unsaturated bond, 2) a pyrimidine-type organic dye compound (spectral sensitizing dye) expressed by the general formula (I), and 3) a radical generating agent which can generate a ridical by interacting with the above-described dye and, optionally, may further comprises 4) other components whereupon the above-described photopolymerizable composition according to the present invention is used in the recording material according to the present invention.

When the above-described photopolymerizable composition is irradiated by light, the above-described spectral sensitizing dye absorbs light thereby interacting with the above-described radical generating agent whereupon the radical generating agent generates the radical. The above-described polymerizable compound is subjected to radical polymerization by this radical and cured whereupon an image is formed.

Details of the above-described polymerizable compound have already been described above, and plural types of such polymerizable compounds can be contained in the photopolymerizable composition. As the recording material according to the above-described first aspect, at least one type thereof may be the color forming component B having a portion which allows the color forming component A to form color whereupon a color forming component having an ethylenically unsaturated bond (polymerizable group) in a same molecule as described below is used.

On the other hand, as the recording material according to the above-described second aspect, the polymerizable compound may concurrently have a function as the color-forming suppressing compound whereupon a polymerizable compound having the color forming component A and a portion which suppresses a reaction with the color forming component B which allows the above-described color forming component A to form color in a same molecule is used.

Such polymerizable compounds will be described below together with the color forming components (A and B) contained in a recording layer and the like.

A content of the above-described photopolymerizable composition in the recording layer is preferably from 0.1 $g/m^2$ to 50 $g/m^2$, and more preferably from 1 $g/m^2$ to 30 $g/m^2$.

Color Forming Component

In the recording material according to the present invention, the recording layer contains the above-described color forming components A and B as color forming sources, together with the photopolymerizable composition. In the case of the recording material according to the above-described first aspect, the recording layer contains the photopolymerizable composition as well as the color forming component A whereupon the color forming component B which is contained in the side of the above-described photopolymerizable composition as a polymerizable compound reacts with the above-described color forming component A thereby forming color.

As combinations of the color forming component A and the color forming component B which perform as color forming sources constituting an image portion, combinations of from (1) to (19) to be described below are mentioned. Further, the color forming component A and the color forming component B are described in this order in the following combinations:

(1) a combination of an electron donating dye precursor and an electron accepting compound;

(2) a combination of a diazo compound and a coupling component (hereinafter referred to appropriately as "coupler compound");

(3) a combination of an organic acid metallic salt such as silver behenate, or silver stearate, and a reducing agent such as protocatechuic acid, spiroindan, or hydroquinone;

(4) a combination of a long-chain fatty acid salt such as ferric stearate, or ferric myristate, and one of phenols such as tannic acid, gallic acid, and ammonium salicylate;

(5) a combination of an organic acid heavy metal salt such as a nickel, a cobalt, a lead, a copper, an iron, a mercury, or a silver salt of acetic acid, stearic acid, palmitic acid, or the like, and an alkaline metal sulfide or an alkaline earth metal sulfide such as calcium sulfide, strontium sulfide, or potassium sulfide, or a combination of the above-described organic acid heavy metal salt, and an organic chelating agent such as s-diphenylcarbazide, or diphenylcarbazone;

(6) a combination of a heavy metal sulfate such as a sulfate of silver, lead, mercury, or sodium, and a sulfur compound such as sodium tetrathionate, sodium thiosulfate, thioureae;

(7) a combination of a fatty acid ferric salt such as ferric stearate, and an aromatic polyhydroxy compound such as 3,4-hydroxytetraphenylmethane;

(8) a combination of an organic acid metallic salt such as silver oxalate, or mercury oxalate, and an organic polyhydroxy compound such as a polyhydroxy alcohol, glycerin, or a glycol;

(9) a combination of a fatty acid ferric salt such as ferric pelargonate, or ferric laurate, and thiocetylcarbamide or an isothiocetylcarbamide derivative;

(10) a combination of an organic acid lead salt such as lead caproate, lead pelargonate, or lead behenate, and a thiourea derivative such as ethylene thiourea, or N-dodecylthiourea;

(11) a combination of a higher fatty acid heavy metal salt such as ferric stearate, or copper stearate, and zinc dialkylditiocarbamate.

(12) a combination, for example, of resorcin and a nitroso compound, which forms oxazine dye;

(13) a combination of a formazan compound, and a reducing agent and/or a metallic salt;

(14) a combination of a protected dye (or a leuco dye) precursor, and a remover of a protection material;

(15) a combination of an acidic color forming agent, and an oxidizing agent;

(16) a combination of one of phthalonitriles, and one of diiminoisoindolines (a combination which generates phthalocyanine);

(17) a combination of one of isocyanates and one of diiminoisoindolines (a combination which generates a color pigment);

(18) a combination of a pigment precursor, and an acid or a base (a combination which formes a pigment); and

(19) a combination of a paraphenylene diamine derivative or an oxide precursor of a para-aminophenol-derivative, and a coupling component (coupler compound).

Among these combinations of two components as the color forming sources. (1) a combination of an electron donating dye precursor and an electron accepting compound, (2) a combination of an diazo compound and a coupling component (hereinafter referred to appropriately as "coupler compound"), (14) a combination of a protected dye (or a leuco dye) precursor, and a remover of a protective material; and (19) a combination of a paraphenylene diamine derivative or a precursor of an oxide of a para-aminophenol derivative, and a coupling component (coupler compound) are preferable. Namely, as the color forming component A, the electron donating dye precursor, the diazo compound, the dye precursor or the oxide precursor is preferable, while, as the color forming component B, the electron accepting compound, the coupler compound or the remover of the protection material is preferable.

When an electron donating colorless dye precursor is used as the color forming component A, as such electron donating colorless dye precursors, mentioned are various types of compounds, which are known in thermal-sensitive paper, pressure-sensitive paper or the like, such as a phthalide type compound, a fluoran type compound, a phenothiazine type compound, an indolyl phthalide type compound, a leucoauramine type compound, a rhodamine lactam type compound, a triphenylmethane type compound, a triazene type compound, a spiropyran type compound, a pyridine type compound, a pyrazine type compound, and a fluorene type compound.

As such phthalide type compounds, mentioned are compounds described in, for example, U.S. Reissue Pat. No, 23,024, U.S. Pat. Nos. 3,491,111, 3,491,112, 3,491,116, and 3,509,174. Specific examples of the phthalide type compounds include 3,3-bis(p-dimethylaminophenyl)-6- dimethylaminophthalide, 3,3-bis(p-diethylaminophenyl) phthalide, 3,3-bis(2-methyl-1-octylindole-3-yl)phthalide, 3-(4-dipropylamino-2-acetylaminophenyl)-3-(2-methyl-1-octylindole-3-yl)-4-azaphthalide, 3-(4-diethylamino-2-ethoxyphenyl)-3-(2-methyl-1-octylindole-3-yl)phthalide, 3-(4-diethylamino-2-ethoxyphenyl)-3-(2-methyl-1-octylindole-3-yl)-4-azaphthalide, 3-(4-diethylamino-2-methylphenyl)-3-(1-ethyl-2-methylindole-3-yl)-4-azaphthalide, 3,3-bis(4-diethylamino-2-butyloxyphenyl)-4-azaphthalide, and 3-(4-diethylamino-2-butyloxyphenyl)-3-(2-methyl-1-pentylindole-3-yl)-4-azaphthalide.

As such fluoran type compounds, mentioned are compounds described in, for example, U.S. Pat. Nos. 3,624,107, 3,627,787, 3,641,011, 3,462,828, 3,681,390, 3,920,510, and 3,959,571. Specific examples of the fluoran type compounds include 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-methyl-6-N-ethyl-N-isobutylaminofluoran, 2-anilino-6-dibutylaminofluoran, and 2-anilino-3-methyl-6-N-methyl-N-tetrahydrofurfurylaminofluoran.

As such thiazine type compounds, mentioned are, for example, benzoylleucomethylene blue, and p-nitrobenzylleucomethylene blue.

As such leucoauramine type compounds, mentioned are, for example, 4,4'-bis-dimethylaminobenzhydrinbenzyl ether, N-halophenyl-leucoauramine, and N-2,4,5-trichlorophenylleucoauramine As such rhodamine lactam type compounds, mentioned are, for example, rhodamine-B-anilinolactam, and rhodamine-(p-nitrino)lactam.

As such spirodipyran type compounds, mentioned are compounds described in, for example, U.S. Pat. No. 3,971,808. Specific examples of the spirodipyran type compounds include 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphtho-(3-methoxy-benzo)spiropyran, and 3-propyl-spiro-dibenzopyran.

As such pyridine type and pyrazine type compounds, mentioned are compounds described in, for example, U.S. Pat. Nos. 3,775,424, 3,853,869, and 4,246,318.

As such fluorene type compounds, mentioned are compounds described in, for example, Japanese Patent Application No, 61-240989.

As dye precursors for forming cyan, magenta, and yellow, respective dye precursors described in, for example, U.S. Pat. No. 4,800,149 can be used.

Further, as an electron donating dye precursor for forming yellow, dye precursors described in U.S. Pat. Nos. 4,800,148, 5,126,233, JP-B No. 7-88105 and the like can also be used, while, as an electron donating dye precursor for forming cyan, a dye precursor described in JP-A No. 63-53542 and the like can also be used.

When the above-described electron donating dye precursor is used, an electron accepting compound is used as a color forming component B which allows the above-described electron donating dye precursor to form color. As the above-described electron accepting compound, mentioned are one of phenol derivatives, one of salicylic acid derivatives, a metal salt of an aromatic carboxylic acid, acid clay, bentonite, a novolak resin, a metal-treated novolak resin, a metal complex, and the like, which are known in thermal-sensitive paper, pressure-sensitive paper. Specific examples of such electron accepting compounds include those described in JP-B Nos. 40-9309 and 45-14039, JP-A Nos. 52-140483, 48-51510, 57-210886, 58-87089, 59-11286, 60-176795, and 61-95988.

Among these compounds, mentioned as the phenol derivatives are 2,2-bis(4-hydroxyphenyl)propane, 1,1-bis(3-chloro-4-hydroxyphenyl)cyclohexane, 4-hydroxyphenyl-4'-isopropyloxyphenylsulfone, bis(3-aryl-4-hydroxyphenyl) sulfone, α,α'-bis(4-hydroxyphenyl)-1,4-diisopropylbenzene, p-hydroxybenzyl benzoate, and the like.

Examples of salicylic acid derivatives include 4-pentadecylsalicylic acid, 3,5-di(α-methylbenzyl)salicylic acid, 3,5-di(tert-octyl)salicylic acid, 5-octadecylsalicylic acid, 5-α-(p-α-methylbenzylphenyl)ethylsalicylic acid, 3-α-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, and 4-octadecyloxysalicylic acid, and zinc, aluminum, calcium, and copper salts thereof.

In the above-described first aspect of the recording material, the color forming component B functions also as a polymerizable compound having an ethylenically unsaturated bond. Therefore, at least one of polymerizable compounds of the recording material according to the first aspect is an electron accepting compound which has an electron accepting group and an ethylenically unsaturated bond (hereinafter referred to also as "polymerizable group") in one molecule.

As the color forming component B in this case, mentioned are compounds, and the like which can be synthesized with reference to following compounds: 3-halo-4-hydroxybenzoic acid described in JP-A No. 4-226455; a methacryloxyethyl ester and an acryloxyethyl ester of benzoic acid having a hydroxy group described in JP-A No. 63-173682; esters of benzoic acid having a hydroxy group and hydroxymethylstyrene described in JP-A Nos. 59-83693, 60-141587, and 62-99190; hydroxystyrene described in EP No. 29323; N-vinylimidazole complexes of zinc halide described in JP-A Nos. 62-167077 and 62-16708; an electron accepting compound described in JP-A No. 63-317558 and the like.

Among these compounds having an electron accepting group and a polymerizable group in a same molecule, 3-halo-4-hydroxybenzoic acid derivatives expressed by the following general formula are preferable:

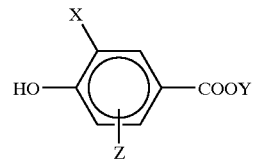

wherein X represents a halogen atom, with a chlorine atom being preferable; Y represents a monovalent group having a polymerizable ethylene group, with an aralkyl group, an acryloyloxyalkyl group, or a methacryloyloxyalkyl group, which have a vinyl group, being preferable and an acryloyloxyalkyl group having from 5 carbon atoms to 11 carbon atoms, or a methacryloyloxyalkyl group having from 6 carbon atoms to 12 carbon atoms is particularly preferable; and Z represents a hydrogen atom, an alkyl group, or an alkoxyl group.

Examples of such 3-halo-4-hydroxybenzoic acids include vinylphenethyl 3-chloro-4-hydroxybenzoate, vinylphenylpropyl 3-chloro-4-hydroxybenzoate, 2-acryloyloxyethyl 3-chloro-4-hydroxybenzoate, 2-methacryloyloxyethyl 3-chloro-4-hydroxybenzoate, 2-acryloyloxypropyl 3-chloro-4-hydroxybenzoate, 2-methacryloyloxypropyl 3-chloro-4-hydroxybenzoate, 3-methacryloyloxypropyl 3-chloro-4-hydroxybenzoate, 3-acryloyloxypropyl 3-chloro-4-hydroxybenzoate, 3-methacryloyloxypropyl 3-chloro-4-hydroxybenzoate;

4-acryloyloxybutyl 3-chloro-4-hydroxybenzoate, 4-methacryloyloxybutyl 3-chloro-4-hydroxybenzoate, 2-acryloyloxyethyl 3-chloro-4-hydroxybenzoate, 5-acryloyloxypentyl 3-chloro-4-hydroxybenzoate, 5-methacryloyloxypentyl 3-chloro-4-hydroxybenzoate, 6-acryloyloxyhexyl 3-chloro-4-hydroxybenzoate, 6-methacryloyloxyhexyl 3-chloro-4-hydroxybenzoate, 8-acryloyloxyoctyl 3-chloro-4-hydroxybenzoate, and 8-methacryloyloxyoctyl 3-chloro-4-hydroxybenzoate.

Further, preferable examples of the above compound having the electron accepting group and the polymerizable group in a same molecule include styrenesulfonylaminosalicylic acid, vinylbenzyloxyphthalic acid, zinc β-methacryloxyethoxy salicylate, zinc β-acryloxyethoxy salicylate, vinyloxyethyloxybenzoic acid, β-methacryloxyethyl orsellinate, β-acryloxyethyl orsellinate, β-methacryloxyethoxyphenol, β-acryloxyethoxyphenol;

β-methacryloxyethyl-β-resorcinate, β-acryloxyethyl-β-resorcinate, hydroxyatyrene suufonic acid-N-ethylamide, β-methacryloxypropyl p-hydroxybenzoate, β-acryloxypropyl p-hydroxybenzoate, methacryloxymethylphenol, acryloxymethylphenol, methacrylamide propane sulfonic acid, acrylamide propane sulfonic acid, β-methacryloxyethoxy-dihydroxybenzene, β-acryloxyethoxy-dihydroxybenzene, γ-styrenesulfonyloxy-β-methacryloxypropane carboxylic acid;

γ-acryloxypropyl-α-hydroxyethyloxysalicylic acid, β-hydroxyethoxylphenol, β-methacryloxyethyl p-hydroxy cinnamate, β-acryloxyethyl p-hydroxy cinnamate, 3,5-distyrene sulfonamide phenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphtholc acid;

3-β-hydroxyethoxyphenol, β-methacryloxyethyl p-hydroxybenzoate, β-acryloxyethyl p-hydroxybenzoate, β'-methacryloxyethyl β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and metal salts thereof (for example, zinc salt and the like).

When the electron donating dye precursor is used as the color forming component A while the electron accepting compound is used as the color forming component B, a content of the above-described electron donating dye precursor is preferably from 0.05 g/m² to 5 g/m², and more preferably from 0.1 g/m² to 3 g/m² in the recording layer. While, a content of the above-described electron accepting compound is preferably from 0.5 part by weight to 20 parts by weight, and more preferably from 3 parts by weight to 10 parts by weight, based on 1 part by weight of the above-described electron donating dye precursor. When the latter content is less than 0.5 part by weight, there is a case in which a sufficient color forming density can not be obtained whereas, when it is more than 20 parts by weight, there is a case in which sensitivity is deterioted or a coating aptitude is deteriorated.

On the other hand, when a diazo compound is used as the color forming component A, it is preferable that a compound expressed by the following formula is used:

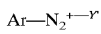

wherein Ar represents an aromatic cyclic group; and Y' represents an acid anion.

In the above-described formula, Ar represents a substituted or unsubstituted aryl group. Examples of substituents employed in such substituted aryl groups include an alkyl group, an alkoxy group, an alkylthio group, an aryl group, an aryloxy group, an arythio group, an acyl group, an alkoxycarbonyl group, a carbamoyl group, a carboamide group, a sufonyl group, a sulfamoyl group, a sulfonamide group, a ureide group, a halogen group, an amino group, and a heterocyclic group. These substituents may further be substituted.

Further, as the aryl group, an aryl group having from 6 carbon atoms to 30 carbon atoms is preferable. Examples of such aryl groups include a phenyl group, a 2-methylphenyl group, a 2-chlorophenyl group, 2-methoxyphenyl group, 2-butoxyphenyl group, 2-(2-ethylhexyloxy) phenyl group, 2-octyloxy phenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl)phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, and 4-(N-benzyl-N-methylamino)-2-dodecyloxycarboniypbenyl group.

These groups may further be substituted by an alkyloxy group, an alkylthio group, a substituted phenyl group, a cyano group, a substituted amino group, a halogen atom, a heterocyclic group, and the like.

As the diazo compound which can favorably be used as the color forming component A, mentioned are diazo compounds illustrated in, for example, paragraphs of from 44 to 49 of JP-A No. 7-276808. However, the present invention is by no means limited thereto.

A maximum absorption wavelength $\lambda_{max}$ of the diazo compound is preferably 450 nm or less, and more, preferably from 290 nm to 440 nm from the standpoint of effectiveness thereof. Further, it is preferable that the diazo compound has carbon atoms of 12 or more, has solubility to water of 1% or less, and solubility to ethyl acetate is 5% or more.

Further, the diazo compounds as the color forming component A may be used alone or in mixtures of two types or more in accordance with various types of objects such as a hue adjustment.

When the above-described diazo compound is used, a coupler compound (having no polymerizable group) or a coupler compound having a polymerizable group is used as the color forming compound B.

Both of the above-described coupler compounds are to form a dye by coupling with the diazo compound in a basic atmosphere and/or a neutral atmosphere whereupon a plurality of types thereof can simultaneously be used in accordance with various types of purposes such as the hue adjustment.

Specific examples of such coupler compounds having a polymerizable group include a so-called active methylene compound which has a methylene group adjacent to a carbonyl group, a phenol derivative, a naphthol derivative, an azole dervative, and a condensed heterocycle type azole derivative. These compounds are appropriately selected and used within a scope of conforming to an object of the present invention.

As coupler-skeleton compounds (couplers) in the above-described coupler compounds having a polymerizable group, couplers such as the so-called active methylene compound having a methylene group adjacent to a carbonyl group, a phenol derivative, a naphthol derivative, an azole derivative, and a condensed heterocycle-type azole derivative are preferably used. Specific examples of the couplers include resorcin, phloroglucine, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalenesulfonic acid, 2-hydroxy-3-naphthalenesulfonic acid anilide, 2-hydroxy-3-naphthalenesulfonic acid-morpholinopropylamide, 2-hydroxy-3-naphthalenesulfonic acid-2-ethylhexyloxy propylamide, 2-hydroxy-3-naphthalenesulfonic acid-2-ethylhexylamide, 5-acetamide-1-naphthol, sodium 1-hydroxy-8-acetamide naphthalene-3,6-disulfonate, 1-hydroxy-8-acetamide naphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexane barbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetamide)toluene, 1,3-bis-(pivaloylacetamidomethyl)benzene, benzoylacetonitrile, thenoylacetonitrile, acetoacetanilide, benzoylacetanilide, pyvaloylacetanilide, 2-chloro-5-(N-n-butylsulfamoyl)-1-pyvaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one, and 1-(4-n-octyloxyphenyl)-3-tert-butyl-5-aminopyrazole.

As for details of the coupler compounds, coupler compounds further described in JP-A Nos. 4-201483, 7-223367, 7-223368, 7-323660, 5-278608, 5-297024, 6-18669, 6-18670, 7-316280, 9-216468, 9-216469, 9-319025, 10-035113, 10-193801, 10-264532, and the like can be taken as reference.

A coupler compound is to form a dye by coupling with a diazo compound in a basic atmosphere and/or a neutral atmosphere whereupon a plurality of types thereof can simultaneously be used in accordance with various types of purposes such as a hue adjustment and the like.

Specific examples of coupler compounds each having a polymerizable group are shown below; however, the present invention is by no means limited thereto.

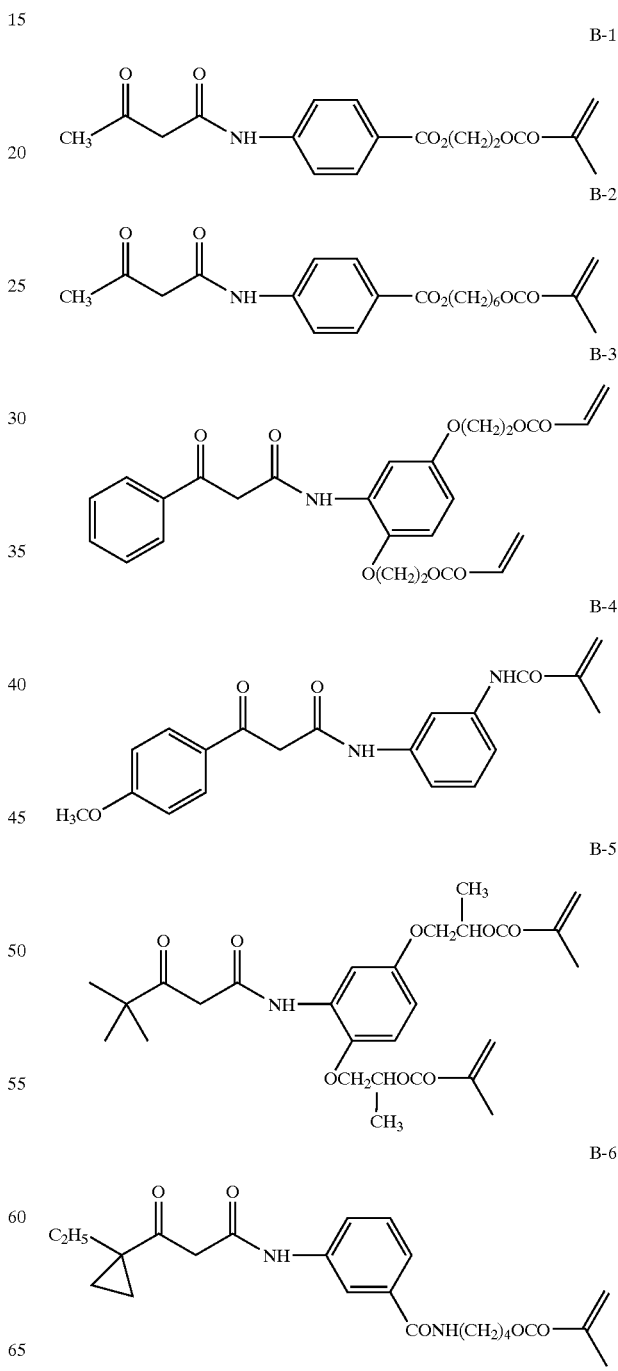

-continued
B-7
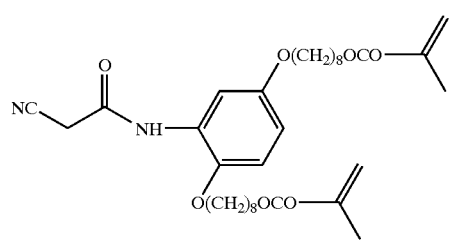
B-8
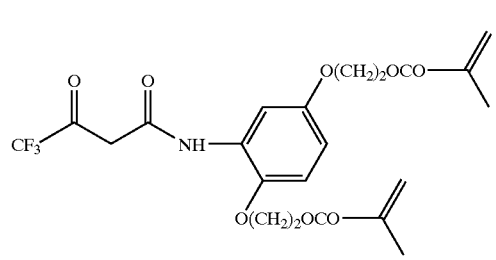
B-9
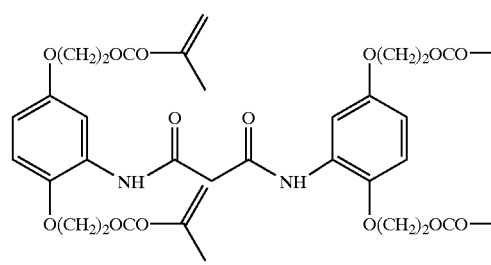
B-10
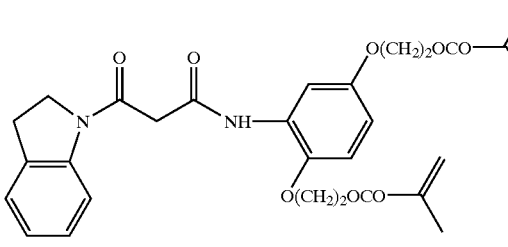
B-11
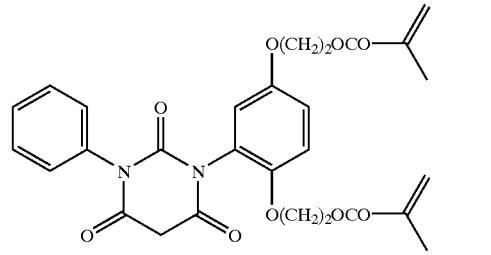
B-12
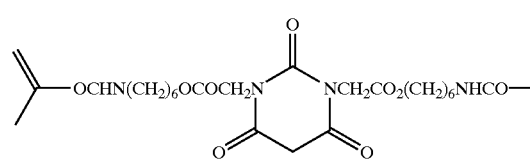
-continued
B-13
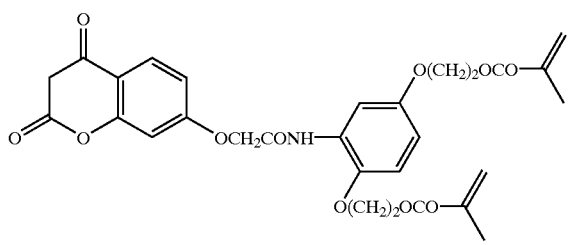
B-14
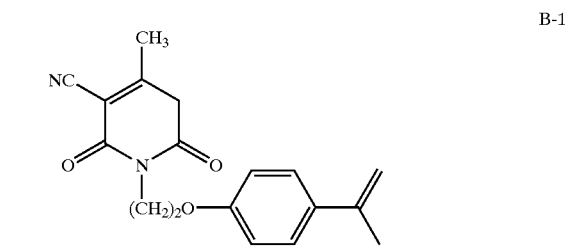
B-15
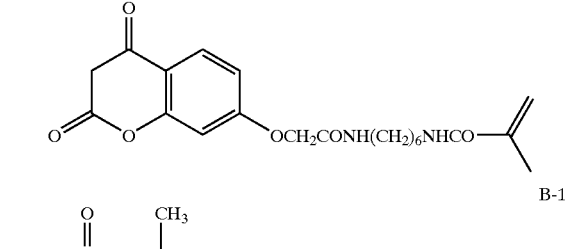
B-16
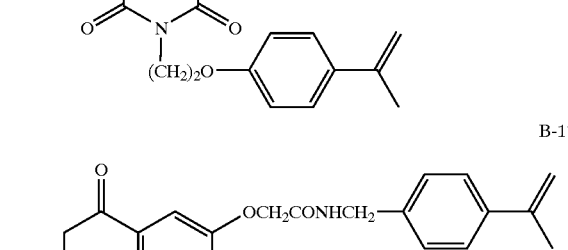
B-17
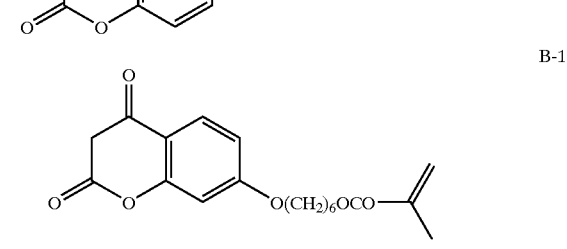
B-18
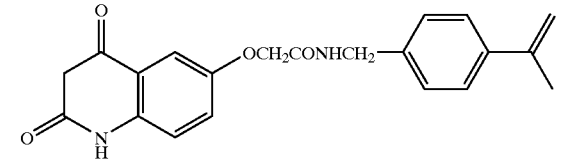
B-19
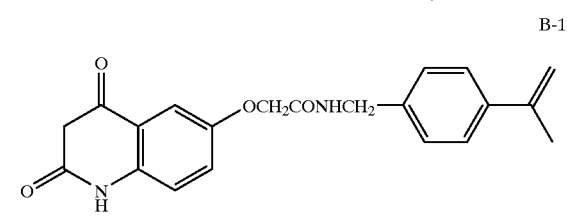

B-20
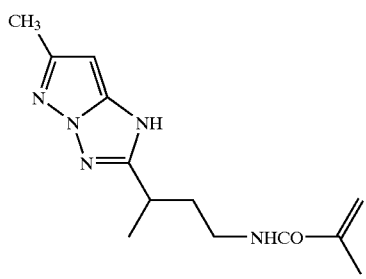
B-21
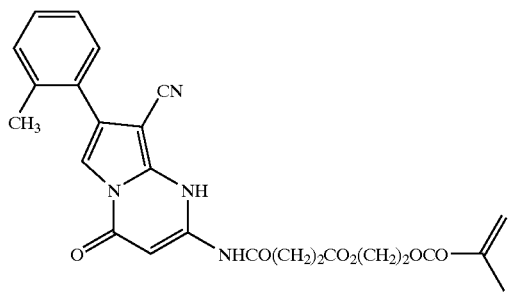
B-22
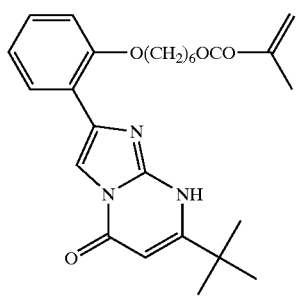
B-23
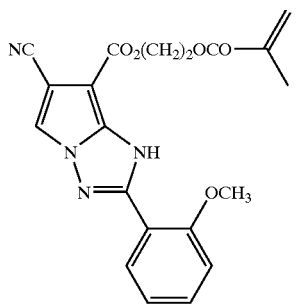
B-24
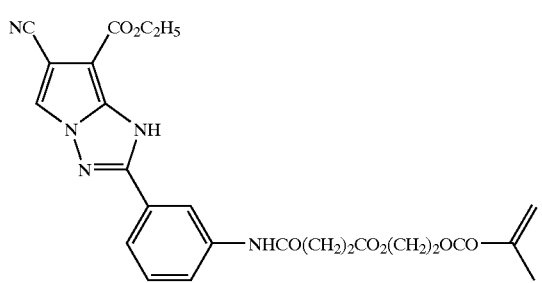
B-25
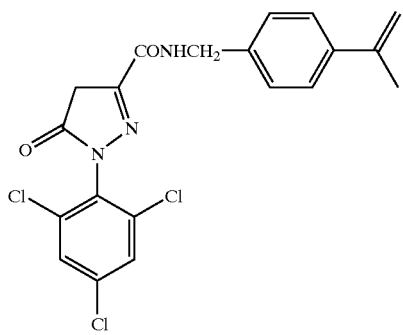
B-26
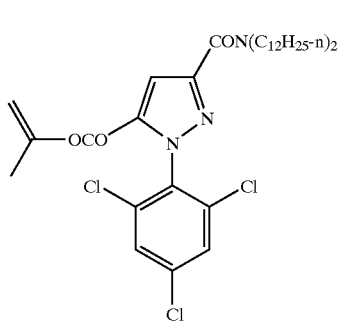
B-27
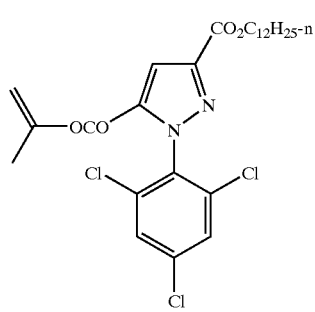
B-28
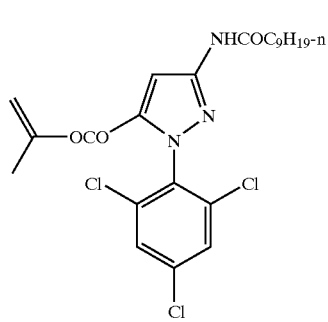
B-29
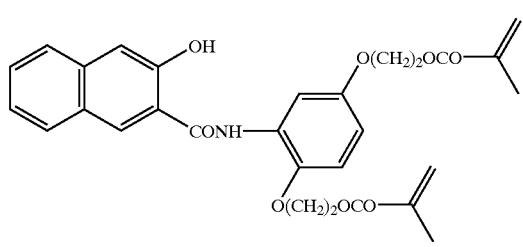

-continued

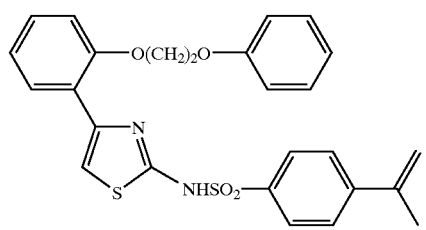
B-30

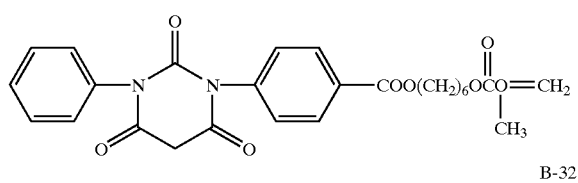
B-31

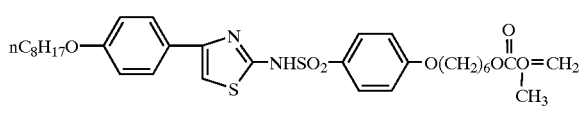
B-32

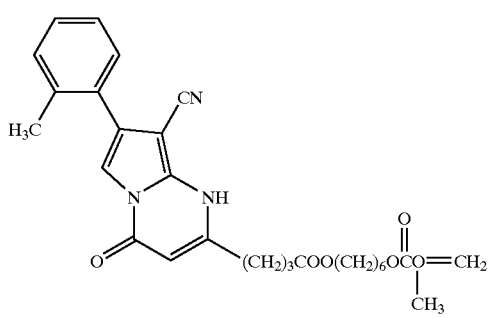
B-33

As coupler compounds having no polymerizable group, mentioned are compounds recited as coupler skeleton compounds in the above-described coupler compounds having a polymerizable group.

When a diazo compound is used as the color forming component A while a coupler is used as the color forming component B. a content of the above-described diazo compound in a recording layer is preferably from 0.02 g/m² to 5.0 g/m², and more preferably from 0.05 g/m² to 3.0 g/m².

When the above-described content is less than 0.02 g/m², there is a case in which a sufficient color forming density can not be obtained, whereas, when it is more than 5.0 g/m², there is a case in which an application aptitude of a coating liquid is deteriorated.

Further, a quantity of the above-described coupler compound to be used is preferably from 0.5 part by weight to 20 parts by weight, and more preferably from 1 part by weight to 10 parts by weight, based on 1 part by weight of the above-described diazo compound. When the quantity is less than 0.5 part by weight, there is a case in which a sufficient color forming property can not be obtained, whereas, when it is more than 20 parts by weight, there is a case in which an application aptitude in deteriorated.

The coupler compound which is used as the color forming component B can be added with other components as well as a water-soluble polymer and, then, dispersed in a solid state by a sandmill or the like and, thereafter, put in use; however, it can be added with an appropriate emulsifying aid and, then, emulsified and, thereafter, put in use as an emulsified product. On this occasion, a dispersion method in a solid state or an emulsification method is not limited to a particular type, but any known method can be available. Details of such methods are described in JP-A Nos. 59-190886, 2-141279 and 7-17145.

For the purpose of promoting a coupling reaction between a diazo compound and a coupler, organic bases such as tertiary amines, piperidines, piperazines, amidines, formamidines, pyridines, guanidines, and morpholines can be used.

Examples of such organic bases include piperazines such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)-2-hydroxypropyl] piperazine, N,N'-bis(3-phenylthio-2-hydroxypropyl) piperazine, N,N'-bis[3-(β-naphthoxy)-2-hydroxypropyl] piperazine, N-3-(β-naphthoxy)-2-hydroxypropyl-N'-methylpiperazine, and 1,4-bis{[3-(N-methylpiperazino)-2-hydroxy] propyloxy}benzene, morpholines such as N-[3-(β-naphthoxy)-2-hydroxyl]propylmorpholine, 1,4-bis[(3-morpholino-2-hydroxy)propyloxy]benzene, and 1,3-bis[(3-morpholino-2-hydroxy)propyloxy]benxene, piperidines such as N-(3-phenoxy-2-hydroxypropyl) piperidine, and N-dodecylpiperidine, triphenyl guanidine, tricyclohexyl guanidine, dicyclohexyl phenyl guanidine, 4-hydroxybenzoic acid 2-N-methyl-N-benzylaminoethyl ester, 4-hydroxybenzoic acid 2-N,N-di-n-butylaminoethyl ester, 4-(3-N,N-dibutylaminopropoxy)benzene sulfonamide, and 4-(2-N,N-dibutylaminoethoxycarbonyl)phenoxyacetamide.

These organic bases may be used either each individually or in a mixture of at least two types thereof.

These organic bases are described in JP-A Nos. 57-123086, 60-49991 and 60-94381, Japanese Patent Application Nos. 7-228731, 7-235157 and 7-235158, and the like.

In a case in which the above-described organic bases can be used, an organic base having a polymerizable group may also be used as an organic base.

When the organic base having a polymerizable group is used in the above-described recording material of the first aspect, a diazo compound and a coupler which are taken as the color forming component A are concurrently microencapsulated, and the organic base having a polymerizable group is allowed to function as the color forming component B. When the diazo compound and the coupler which are taken as the color forming component A are concurrently microencapsulated, the diazo compound and the coupler are used in a combination such that a color forming reaction does not occur when the base is absent.

Further, in the above-described recording material of the first aspect, it is also possible that the diazo compound is used as the above-described color forming component A, and the coupler having a polymerizable group and the organic base having a polymerizable group are concurrently used as the color forming component B.

A quantity of the above-described organic base to be used is not particularly limited; however, it is preferable that the organic base is used in a range of from 1 mole to 30 moles, based on 1 mole of the diazo compound.

Further, it is also possible to add a color forming aid for the purpose of promoting the color forming reaction. As such color forming aids, mentioned are a phenol derivative, a naphthol derivative, an alkoxy-substituted benzene, an alkoxy-substituted naphthalene, a hydroxy compound, a carboxylamide compound, a sulfonamide compound and the like.

A polymerizable compound to be used in the recording material of the second aspect will be explained.

In the above-described recording material of the second aspect, a recording layer thereof comprises a color-forming suppressing compound (hereinafter referred to also as "polymerizable color-forming suppressing compound"), as a polymerizable compound, which has a portion which suppresses a reaction between the color forming component A and the color forming component B that allows the color forming component A to form color by reacting therewith, and an ethylenically unsaturated bond in a same molecule.

When the electron donating dye precursor and the electron accepting compound having no polymerizable group are used as the above-described color forming compnent A and the the above-described color forming component B respectively, a photopolymerizable monomer (hereinafter referred to also as "photopolymerizable monomer $D_1$") having a portion which suppresses a reaction between the electron donating dye precursor and the electron accepting compound and at least one vinyl group in a molecule is preferably used as the above, described polymerizable color-forming suppressing compound.

Specific examples of such photopolymerizable monomers $D_1$ include acrylic acid and a salt thereof, acrylic acid esters, acrylamides, methacrylic acid and a salt thereof, methacrylic acid esters, methacrylamides, maleic anhydride, maleic acid esters, itaconic acid, itaconic acid esters, styrenes, vinyl ethers, vinyl esters, N-vinyl heterocycles, aryl ethers, and allyl esters.

Among other things, a compound having a plurality of vinyl groups in a molecule is preferable; on this occasion, specific examples of such compounds include acrylic acid esters or methacrylic acid esters of polyvalent alcohols such as trimethylolpropane, and pentaerythritol, acrylic acid eaters or methacrylic acid esters of polyvalent phenols and bisphenols such as resorcinol, pyrogallol, and phloroglucinol, epoxy resins having an acrylate or a methacrylate terminal group, and polyesters having an acrylate or a methacrylate terminal group.

Among these compounds, ethylene glycol diacrylate, ethylene glycol dimethacrylate, trimethylolpropane triacrylate, pentaerythritol tetraacrylate, dipentaerythritol hydroxypentacrylate, hexane diol-1,6-dimethacrylate, and diethylene glycol dimethacrylate are particularly preferable.

A molecular weight of the above-described photopolymerizable monomer $D_1$ is preferably from about 100 to about 5000, and more preferably from about 300 to about 2000.

When the above-described photopolymerizable monomer $D_1$ is used as the above-described polymerizable color-forming suppressing compound, a quantity thereof to be used is preferably from 0.1 part by weight to 10 parts by weight, and more preferably from 0.5 part weight to 5 parts by weight, based on 1 part by weight of the electron donating compound which is used in combination with the coupler compound having no polymerizable group. When the above-described quantity is less than 0.1 part by weight, there is a case in which a latent image can not be formed in an exposure step while, when the quantity is more than 10 parts by weight, there is a case in which color forming density is deteriorated.

When the diazo compound and the coupler compound having no polymerizable group are used as the above-described color forming component A and the above-described color forming component B respectively, a photopolymerizable monomer (hereinafter referred to also as "photopolymerizable monomer $D_2$") having an acidic group which suppresses a coupling reaction between the diazo compound and the coupler compound, and at least one vinyl group in a molecule is preferably used as the above-described polymerizable color-forming suppressing compound.

Preferable examples of such photopolymerizable monomers $D_2$ include styrenesulfonylaminosalicylic acid, vinylbenzyloxyphthalic acid, zinc β-methacryloxyethoxy salicylate, zinc β-acryloxyethoxy salicylate, vinyloxyethyloxybenzoic acid, β-methacryloxyethyl orsellinate, β-acryloxyethyl orsellinate, β-methacryloxyethoxyphenol, β-acryloxyethoxyphenol, β-methacryloxyethyl-β-resorcinate, β-acryloxyethyl-β-resorcinate, hydroxystyrene sulfonic acid-N-ethylamide, β-methacryloxypropyl p-hydroxybenzoate, β-acryloxypropyl p-hydroxybenzoate, methacryloxymethylphenol, acryloxymethylphenol, methacrylamide propane sulfonic acid, acrylamide propane sulfonic acid, β-methacryloxyethoxy-dihydroxybenzene, β-acryloxyethoxy-dihydroxybenzene, γ-styrenesulfonyloxy-β-methacryloxypropane carboxylic acid, γ-acryloxypropyl-α-hydroxyethyloxysalicylic acid, β-hydroxyethoxylphenol, β-methacryloxyethyl p-hydroxy cinnamate, β-acryloxyethyl p-hydroxy cinnamate, 3,5-distyrene sulfonamide phenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl p-hydroxybenzoate, β-acryloxyethyl p-hydroxybenzoate, β-methacryloxyethyl β-resorcinate, β-methacryloxyethyloxycarbonylhydroxybenzoic acid, β-acryloxyethyloxycarbonylhydroxybenzoic acid, N,N-di-β-methacryloxyethylaminosalicylic acid, N,N-di-β-acryloxyethylaminosalicylic acid, N,N-di-β-methacryloxyethylaminosulfonylsalicylic acid, and N,N-di-β-acryloxyethylaminosulfonylsalicylic acid.

When the above-described photopolymerizable monomer $D_2$ is used as the above-described polymerizable color-forming suppressing compound, a content thereof is preferably from 0.1 part by weight to 10 parts by weight, and more preferably from 0.5 part by weight to 5 parts by weight, based on 1 part by weight of the coupler compound which is used in combination with the coupler compound having no polymerizable group. When the above-described content is less than 0.1 part by weight, there is a case in which a latent image can not be formed in an exposure step while, when it is more than 10 parts by weight, there is a case in which the color forming density is deterioted.

Microcapsule

In the recording material according to the present invention, it is preferable that the color forming component A is contained in the above-described recording layer in a state in which it is enclosed in a microcapsule.

As a microencapsulation method, a known method can be used. Examples of such methods include methods described in; U.S. Pat. Nos. 2,800,457 and 2,800,458 in which the coacervation of a hydrophilic wall forming material is utilized; U.S. Pat. No. 3,267,154, BP No. 990443, and JP-B Nos. 38-1957d, 42-446, and 42-771 in which interfacial polymerization is utilized: U.S. Pat. Nos. 3,418,250 and 3,660,304 in which the crystallization of a polymer is utilized; U.S. Pat. No. 3,796,669 in which an isocyanate polyol wall material is used; U.S. Pat. No. 3,914,511 in which an isocyanate wall material is used; U.S. Pat. Nos. 4,001,140, 4,087,376, and 4,089,802 in which a urea/formaldehyde type or a urea formaldehyde/resorcinol type wall forming material is used; and U.S. Pat. No. 4,025,455 in which a wall material such as a melamine/formaldehyde resin, hydroxypropyl cellulose, or the like is used. Also, other than the above methods, an in-situ method using monomer polymerization which is described in JP-B No. 36-9168and JP-A No. 51-9079; an electrophoretic dispersion and cooling method described in BP Nos. 952807 and 965074: and a spray drying method described in U.S. Pat. No. 3,111,407 and BP No. 930422 can be utilized.

Though the microencapsulation method according to the present invention is not limited to these methods, it is desirable to adopt an interfacial polymerization method in which the color forming component A is dissolved or dispersed in a hydrophobic organic solvent which becomes a core of a capsule to prepare an oil phase and the thus-prepared oil phase is mixed with an aqueous phase in which a water-soluble polymer is dissolved and, then, emulsify-dispersed by a homogenizer or the like and, thereafter, the resultant emulsify-dispersed liquid is heated to generate a polymer-forming reaction at an oil droplet interface thereof to form a microcapsule wall made of a high polymer substance. By means of this method, the capsule having a uniform particle diameter can be formed in a short period of time thereby allowing it to be the recording material excellent in storage ability before use.

A reactant forming the polymer is added to inside an oil droplet and/or outside the oil droplet. Examples of such polymer substances include polyurethane, polyurea, polyamide, polyester, polycarbonate, a urea-formaldehyde resin, a melamine resin, polystyrene, a styrene-methacrylate copolymer, and a styrene-acrylate copolymer. Among these compounds, polyurethane, polyurea, polyamide, polyester, and polycarbonate are preferable, and, among other things, polyurethane and polyurea are particularly preferable. The above-described polymer substances can concurrently be used in two types or more.

Examples of the above-described water-soluble polymers include gelatin, polyvinyl pyrrolidone, and polyvinyl alcohol. Take, for example, a case in which polyurethane is used as a capsule wall material. A polyvalent isocyanate and a second material (for example, polyol or polyamine) which reacts with the polyvalent inocyanate to form a capsule wall are mixed either in an aqueous solution (aqueous phase) of the water-soluble polymer or an oil medium (oil phase) which is to be encapsulated, and then, after the resultant mixture is emulsify-dispersed, it is heated to generate a polymer-forming reaction on the interface of the oil deoplet whereby a microcapsule wall is formed.

As the above-described polyvalent isocyanate and a counterpart, that is, the polyol or the polyamine, which reacts with the polyvalent isocyanate, compounds disclosed in U.S. Pat. Nos. 3,281,383, 3,773,695, and 3,793,268, JP-B Nos. 48-40347 and 49-24159, and JP-A Nos. 48-80191 and 48-84086 can be used.

When the microcapsule containing the color forming component A is prepared, the color forming component A which is microencapsulated may be present in the above-described capsule either in a liquid state or in a solid state.

When the color forming component A is microencapsulated in the liquid state, the color forming component A may be dissolved in a hydrophobic organic solvent and, then, encapsulated. A quantity of the organic solvent to be used is preferably from 1 part by weight to 500 parts by weight, based on 100 parts by weight of the color forming component A.

Ordinary examples of the above-described hydrophobic organic solvents include a phosphoric ester, a phthalate ester, an acrylic ester, a methacrylic ester, other carboxylate esters, a fatty amide, an alkylated biphenyl, an alkylated terphenyl, a chlorinated paraffin, an alkylated naphthalene, a diallylethane, a compound which is in a solid state at room temperature, oligomer-oil, and polymer-oil. Specific examples thereof include compounds described in JP-A Nos. from 59-178451 to 59-178455, 59-178457, 60-242094, 63-85633, 6-194825, 7-13310, 7-13311, 9-106039 and Japanese Patent Application No. 62-75409.

When solubility of the color forming component A for forming the microcapsule in the above-described organic solvent is inferior, a solvent having a low boiling point and a high dissolving property can concurrently be used as an auxiliary solvent. Examples of such solvents having a low boiling point include ethyl acetate, propyl acetate, isopropyl acetate, butyl acetate, and methylene chloride.

On the other hand, as an aqueous phase, an aqueous solution into which a water-soluble polymer is dissolved is used and, then, the above-described oil phase is added thereto, and, thereafter, emulsified dispersion is conducted by a device such as a homogenizer. In this operation, the water-soluble polymer acts as a dispersion medium which not only allows a uniform dispersion to be prepared in an easy manner but also stabilizes the resultant emulsify-dispersed aqueous solution. On this occasion, in order to emulsify-disperse more uniformly and stabilize the resultant emulsify-dispersed aqueous solution, a surfactant may be added to at least one of the oil phase and the aqueous phase. As for the surfactant, it is possible to use a known surfactant for emulsification. When the surfactant is added thereto, a quantity of the surfactant to be added is preferably from 0.1% to 5%, and more preferably from 0.5% to 2%, based on the total weight of the oil phase.

When the color forming component A is microencapsulated, an average particle diameter of such a microcapsule is preferably 20 $\mu$m or less, and more preferably 5 $\mu$m or less from the standpoint of obtaining high resolution. When the thus-formed microcapsule is too small, a surface area per a given solid content becomes large thereby requiring a need for a large quantity of a wall-forming agent; therefore, the above-described average particle diameter is preferably 0.1 $\mu$m or more.

The photopolymerizable composition according to the present invention can broadly be used not only in the above-described recording material according to the present invention, but also in various fields such as ink, color filters, holograms, proofs, sealants, adhesives, planography, resin letterpress, and photoresists. Other components may optionally be added thereto in accordance with respective applications. Further, when the photopolymerizable composition according to the present invention is utilized in other applications than the recording material according to the present invention, it is not necessary that the above-described polymerizable compound functions as the color forming component B and the color-forming suppressing compound as described above, but a polymerizable compound having an ethylenically unsaturated bond can broadly be utilized.

The multi-color recording material, comprising a plurality of mono-color recording layers laminated on a support, is prepared by allowing each of the recording layers to contain a color forming component A which forms a color having a different hue (capable of being enclosed in a microcapsule), a color forming component B which has a portion that forms color by reacting with the color forming component A within a molecule thereof (and which may further have a polymerizable group), and a photopolymerizable composition which is sensitive to light having different wavelengths to form a latent image. In other words, prepared are photopolymerizable compositions which are sensitive to light having different wavelengths by incorporating respective spectral sensitizing dyes having different absorption wavelengths therein. On this occasion, it is preferable that an intermediate layer is provided between any two of the mono-color recording layers.

The multi-layer recording layer of the multi-color recording material according to the present invention can be formed, for example, in a following manner:

The recording layer of the multi-color recording material according to the present invention is constructed by a multi-layer recording layer α having a laminate structure constituted by the steps of providing a first recording layer comprising a microcapsule enclosing a color forming component $A^y$ which forms yellow color, a color forming component $B^y$ which allows the color forming component $A^y$ to form color, and a photopolymerizable composition which is sensitive to a light source central wavelength $\lambda_2$ to form a latent image on a support and, then, on the thus-provided first recording layer, providing a second layer comprising a microcapsule enclosing a color forming component $A^M$ which forms magenta color, a color forming component $B^M$ which allows the color forming component $A^M$ to form color, and a photopolymerizable composition which is sensitive to a light source central wavelength $\lambda_2$ to form a latent image, and, thereafter, on the thus-formed second layer, providing a third recording layer comprising a microcapsule enclosing a color forming component $A^c$ which forms cyan color, a color forming component $B^c$ which allows the color forming component $A^c$ to form color, and a photopolymerizable composition which is sensitive to a light source central wavelength $\lambda_3$ to form a latent image, a multi-layer recording layer β further constituted by the step of optionally interposing an intermediate layer between any two layers of the multi-layer recording layer α, and the like.

When image forming is performed by using the recording material having the above-described multi-color multi-layer recoding layer, by allowing an image exposure to be performed by using a plurality of light sources having different wavelengths from one another each of which corresponds to an absorption wavelength of each recording layer in a process of performing exposure to light imagewise, recording layers having respective absorption wavelengths relative to light sources selectively form latent images whereupon a multi-color image having a high sensitivity and high sharpness can be formed and, further, by subjecting the whole area of the surface of the recording layer to light irradiation, the base portion colored by the photopolymerizable composition including the spectral sensitizing dye remaining in the layer can be decolored whereupon a multi-color image of a high quality having a high contrast can be formed.

Support

As the above-described support, any of paper supports for use in ordinary pressure-sensitive paper, heat-sensitive paper, dry or wet diazo copying paper, and the like can be used. Further, acidic paper, neutral paper, coated paper, plastic film laminated paper, synthetic paper, plastic film and the like can also be used.

The recording material according to the present invention is favorably used in the fields of planography, resin letterpress, a resist or photomask for fabricating a printed circuit board, an application for producing a transfer color-forming sheet or color forming sheet of a black-and-white or a color, and the like. Take, for example, a case in which the recording material according to the present invention is utilized in a photosensitive thermal color-forming sheet. The photosensitive thermal color-forming sheet can be prepared by the steps of dissolving or dispersing components in an appropriate solvent either each individually or in combination of two types or more to prepare solutions or dispersion liquids, mixing the thus-prepared solutions or dispersion liquids within themselves to prepare a coating liquid, applying the thus-prepared coating liquid on a support such as paper, or plastic film, and drying the thus-applied coating liquid. For example, when a predetermined component is microencapsulated, a dispersed liquid of a microcapsule in which any one of components is enclosed is prepared, and another liquid in which other components than the above-described component are dispersed or dissolved in a solvent is separately prepared and, then, the thus-prepared former and latter liquids are mixed with each other to prepare a coating liquid. When the coating liquid is prepared, it is possible to use a homogenizer or the like to allow respective components to be in a favorably dispersed state.

Further, as applying and drying methods, those well known in the art can be used.

The recording material according to the present invention can form an image by performing light exposure for forming a latent image and, at the same time, or after such light exposure, performing a heat-developing treatment.

As a heating method at the time of such heat-developing treatment, a known method can be used; on this occasion, ordinarily, a heating temperature is preferably from 80° C. to 200° C., and more preferably from 85° C. to 130° C. A period of heating time is preferably from 1 second to 5 minutes, and more preferably from 3 seconds to 1 minute.

It is preferable that, after the heat-developing treatment is performed, by subjecting the whole surface of the recording layer to light irradiation, a region which remains unpolymerized is polymerized to fix a formed image and, at the same time, a remaining component such as a spectral sensitizing dye which will deteriorate whiteness of the base portion is decolored, decomposed, or deactivated.

Further, the recording material according to the present invention is capable of preventing a remaining color or the like in the base portion and enhancing whiteness in the base portion by a shorter period of image fixing time than in a case of a conventional recording material.

At the time an image is formed by the above-described method, sensitivity can further be enhanced by providing thereto a step in which the whole surface of the material is preheated uniformly at a predetermined temperature that is less than a color forming temperature. Furthermore, not only the above-described recording method, but also other known recording methods can be utilized.

As described above, the recording material according to the present invention is capable of performing image recording with high sensitivity by using not only ultraviolet light, but also from visible light to infrared light in a completely dry processing system in which a developing liquid or the like is not required and wastes are not generated and, further, is capable of forming a sharp black-and-white or color image which is excellent in decoloration of a non-image portion (base portion) and has a high contrast.

EXAMPLES

The present invention will now be described in more detail with reference to the following embodiments, but the present invention is by no means limited thereto. Unless otherwise stated, "%" and "part" signify "% by weight" and "part by weight", respectively.

Examples 1 to 5

As shown in Table 1, an organic dye illustrated below (a compound expressed by the above-described general formula (1); spectral sensitizing dye) and an organic boron compound are used to prepare a photopolymerizable composition containing components shown below.

The components and contents thereof of the photopolymerizable composition are as follows:

| Pentaerythritol tetraacrylate | 1.41 g |
| Benzyl methacrylate/methacrylic acid | 1.29 g |
| (copolymer having a molar ratio of 73/24) | |
| Methyl ethyl ketone | 12 g |
| Propylene glycol monomethylether acetate | 8.62 g |
| Organic dye (see Table 1) | $1 \times 10^{-1}$ mole |
| Organic boron compound | $6 \times 10^{-1}$ mole |
| (b-1 described below) | |
| Methanol | 6 g |

TABLE 1

|  | Organic dye | Clear step number |
| --- | --- | --- |
| Example 1 | 1 | 8 |
| Example 2 | 2 | 9 |
| Example 3 | 3 | 10 |
| Example 4 | 4 | 12 |
| Example 5 | 5 | 11 |
| Comparative Example 1 | d-1 | Solid |
| Comparative Example 2 | d-2 | 4 |

Organic Dye 1

Organic Dye 2

Organic Dye 3

Organic Dye 4

Organic Dye 5

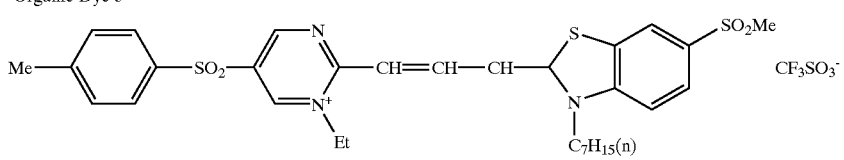

TABLE 1-continued

| Organic dye | Clear step number |
|---|---| d-1

[Chemical structure: bis-indolinium cyanine dye with N-CH₃ groups, connected by -CH= bridge, with ClO₄⁻ counterion]

d-2

[Chemical structure: bis-indolinium trimethine cyanine dye with N-C₇H₁₅ groups, connected by -CH=CH-CH= bridge, with I⁻ counterion]

b-1

[Chemical structure: tetrakis(fluorophenyl)borate-type anion with triphenyl groups (F-substituted) and -B⁻-CH₂- linked to a phenyl-N⁺(C₄H₈)₄ group]

Each of the thus-prepared photopolymerizable compositions was applied on a polyethylene terephthalate film of 100 $\mu$m by a thickness of 2 $\mu$m and dried at 100° C. for 5 minutes and, then, on the thus-applied composition, a coating liquid (1) for a protective layer described below was applied by a thickness of 1 $\mu$m and dried at 100° C. for 2 minutes to prepare a recording material of each of Examples 1 to 5.

The components and contents thereof of the coating liquid (1) for the protective layer are as follows:

| | |
|---|---|
| Water | 98 g |
| Polyvinyl alcohol | 1.7 g |
| Hydroxypropyl methyl cellulose | 1.7 g |
| Polyvinyl pyrrolidone | 8.7 g |

Comparative Examples 1 and 2

Recording materials of Comparative Examples 1 and 2 were prepared in a same manner as in Example 1 except that the above-described organic dyes d-1 and d-2 (spectral sensitizing dyes) were used as described in Table 1 instead of the organic dye used in Example 1.

Image Forming and Evaluation

The thus-prepared recording materials of Examples 1 to 5 and Comparative Examples 1 and 2 were each exposed to light by utilizing a vacuum printing frame device. Exposure of the recording material to light was performed by irradiating light emitted from a 500 W xenon lamp (available from Ushio Inc.) through a step wedge (density step of 0.15, number of density steps of from 1 to 15, available from Fuji Photo Film Co. Ltd. under the trade name of "FUJI STEPGUIDE P") and a sharp-cut filter which cuts off light of 380 nm or less, available from Fuji Photo Film Co. Ltd. under the trade name of "SC38 FILTER") for 10 seconds. After the exposure has been conducted, each recording material was developed by using a developing liquid having a composition described below.

The composition of the developing liquid is as follows:

| | |
|---|---|
| Sodium carbonate anhydride | 10 g |
| Butyl cellosolve | 5 g |
| Water | 11 g |

By performing the above-described development, since an light exposure quantity to a region corresponding to a high step number of the step wedge is small, the photopolymerizable composition in the above-described region was eluted whereupon a surface of polyethylene terephthalate (PET) was exposed. With reference to the recording material of each Example, the region in which the PET surface was exposed by allowing the photopolymerizable composition to be completely eluted was examined to determine a step number (clear step number) of the step wedge corresponding to the region in which an exposed area was largest. It signifies that, the higher the thus, determined step number is, the higher the sensitivity of the recording material is. The results are shown in the above-described Table 1. Further, when there was a case in which the sensitivity was high whereupon the photopolymerizable composition was cured in an entire region which has been exposed to light and the thus-cured photopolymerizable composition remained even after the development was conducted, this case is indicated by the term "solid" in Table 1.

From the results shown in Table 1, it was proved that high sensitivity was obtained in the recording materials of Examples 1 to 5 according to the present invention which used the compound expressed by the general formula (1) as the organic dye. On the other hand, high sensitivity was not obtained in the recording materials of Comparative Examples 1 and 2 which did not use the above described organic dye which has been specified by the present invention.

Example 6

Preparation of Electron Donating Colorless Dye-Enclosing Microcapsule Liquid (1-a) Preparation of Electron Donating Colorless Dye (1)-Enclosing Microcapsule Liquid To 16.9 g of ethyl acetate, dissoled was 8.9 g of an electron donating colorless dye (1) described below, and, to the resultant solution, further added as an encapsulating agent were 20 g of a xylylenediisocyanate/trimethylolpropane (1/3) adduct (available from Takeda Chemical Industries, Ltd. under the trade name of "TAKENATE D-110N") and 2 g of methylene diisocyanate (available from Nippon Polyurethane Industry Co., Ltd. under the trade name of "MILLIONATE MR200"). The resultant solution was added to a mixture of 42 g of a 8% solution of phthalate-modified gelatin and 1.4 g of a 10% solution of sodium dodecylbenzene sulfonate and emulsify-despersed at 20° C. to obtain an emulsified liquid. To the thus-obtained emulsion, added were 14 g of water and 72 g of a 2.9% aqueous solution of tetraethylene pentamine, and the resultant mixture was heated to 60° C. while stirring for two hours to obtain a microcapsule liquid containing microcapsules each having an average particle diameter of 0.5 µm and enclosing an electron donating colorless dye (1) as a core.

Electron Donating Colorless Dye (1)

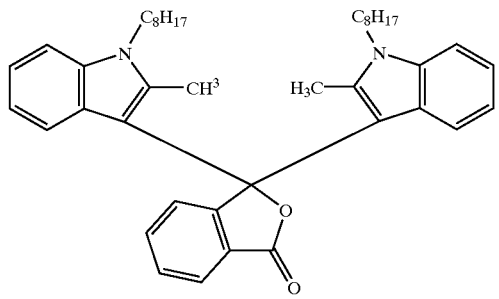

Preparation of Emulsified Liquid of Photopolymerizable Composition (2-a) Preparation of Emulsified Liquid of Photopolymerizable Composition (6)

5.3 g of isopropyl acetate was added to a mixture of 0.05 g of an organic dye shown in Table 2 to be described below, 0.3 g of the above-described organic boron compound, 0.05 g of a polymerization aid (1) to be described below, and 4.2 g of a polymerizable electron accepting compound (1) to be described below, and dissolved therein while stirring.

Polymerization Aid (1)

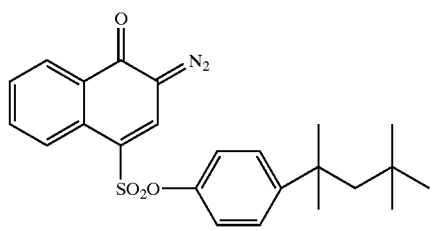

Polymerizable Electron Accepting Compound (1)

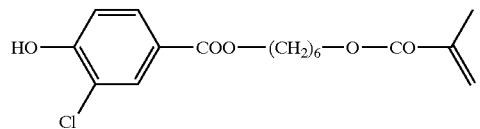

The resultant solution was added to a mixed solution of 13 g of a 8% aqueous solution of gelatin, 0.8 g of a 2% aqueous solution of a surfactant (1) to be described below, and 0.8 g of a 2% aqueous solution of a surfactant (2) to be described below, and emulsified by a homogenizer (available from Nippon Seiki Co., Ltd.) at 10000 rpm for 5 minutes to obtain an emulsified liquid of the photopolymerizable composition (6).

Surfactant (1)

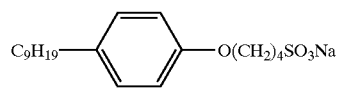

Surfactant (2)

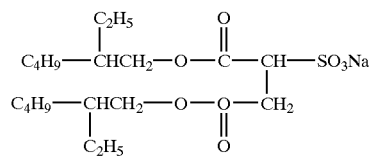

Preparation of Coating Liquid for Recording Layer (3-a) Preparation of Coating Liquid for Recording Layer 4 g of the above-described microcapsule liquid of electron donating colorless dye (1), 12 g of an emulsified liquid of photopolymerizable composition (6), and 12 g of a 15% aqueous solution of gelatin were mixed to prepare a coating liquid for a recording layer.

Preparation of Coating Liquid (2) for Protective Layer (4-a) Preparation of Coating Liquid (2) for Protective Layer 4.5 g of a 10% aqueous solution of gelatin, 4.5 g of distilled water, 0.5 g of a 2% aqueous solution of a surfactant (3) to be described below, 0.3 g of a 2% aqueous solution of a surfactant (4) to be described below, 0.5 g of a 2% aqueous solution of a film hardener to be described below, an appropriate quantity, which is sufficient to make up a coating quantity to be 50 mg/m$^2$, of colloidal silica as mattifying agent (available from Fuji Devison Chemical Co., Ltd. under the trade name of "SYLOID 72") and 1 g of colloidal silica (available from Nissan Chemical Industries, Ltd. under the trade name of "SNOWTEX N") were mixed to prepare a coating liquid (2) for protective layer.

Surfactant (3)

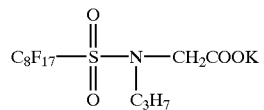

Surfactant (4)

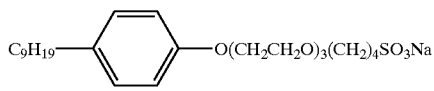

Film Hardener

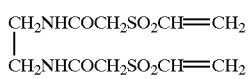

Support

A white-colored polyester film (available from Toray Industries, Inc. under the trade name of "LUMIRROR E68L") loaded with a white pigment and having a thickness of 100 μm was prepared as a support. The above-described coating liquid (6) for recording layer was applied on the thus-prepared support by using a coating bar such that a weight of a coating layer becomes 6 g/m² on a dry basis and dried at 30° C. for 10 minutes. Then, the above-described coating liquid (2) for protective layer was applied on the resultant dried coating layer by a coating bar such that a weight of a coating layer becomes 2 g/m² on a dry basis and dried at 30° C. for 10 minutes to obtain the recording material of Example 6.

Examples 7 to 10

Recording materials of Examples 7 to 10 were prepared in a same manner as in Example 6 except that the above-illustrated organic dyes (spectral sensitizing dyes) and organic boron compounds were used as described in Table 2 instead of the organic dye and the organic boron compound used in Example 6, respectively.

Comparative Examples 3 and 4

Recording materials of Comparative Examples 3 and 4 were prepared in a same manner as in Example 6 except that organic dyes and organic boron compounds were used as described in Table 2 instead of the organic dye and the organic boron compound used in Example 6, respectively.
Image Forming and Evaluation The thus-prepared recording materials 6 to 10 of Examples and recording materials 3 and 4 of Comparative Examples were each irradiated by light emitted from a 500 W xenon lamp through the above-described step wedge and the above-described SC38 filter for 30 seconds by utilizing a vacuum printing frame device to form a latent image. Thereafter, the thus-irradiated recording materials were each heated by a hot plate having a temperature of 125° C. for 15 seconds. On this occasion, a magenta color, which is to be formed when the electron donating colorless dye (1) and the polymerizable electron accepting compound (1) are reacted with each other, was formed in an unexposed portion, whereas a formed color density was decreased or color forming itself was not generated in an exposed portion. Regions in which color was not formed were examined and, then, a step number (clear step number) of the step wedge corresponding to a region in which an exposed light quantity was lowest was determined. It signifies that, the higher the determined step number becomes, the higher the sensitivity of the recording material becomes. Further, when there is a case in which the sensitivity was low and color was formed in all steps, the case is indicated as "solid" in Table 2. The results are shown in Table 2.

TABLE 2

| | Organic dye | Clear step number |
|---|---|---|
| Example 6 | 1 | 8 |
| Example 7 | 2 | 9 |
| Example 8 | 3 | 11 |
| Example 9 | 4 | 12 |
| Example 10 | 5 | 11 |
| Comparative Example 3 | d-1 | Solid |
| Comparative Example 4 | d-2 | 4 |

From the results shown in Table 2, it was found that high sensitivity was obtained and, accordingly, a sharp image having a high contrast was able to be formed in each of the recording materials 6 to 10 of Examples which use the compound expressed by the general formula (1) as the organic dye, whereas high sensitivity was not obtained in each of the recording materials 3 and 4 of Comparative Examples which do not use the above-described organic dye specified by the present invention.

According to the present invention, a photopolymerizable composition which can respond to not only ultraviolet light but also from visibie light to infrared light in a high sensitive manner can be provided. Further, the recording material which is capable of performing image recording favorable in storage stability before use with high sensitivity by using not only ultraviolet light, but also from visible light to infrared light in a completely dry processing system in which a developing liquid or the like is not required and wastes are not generated and, further, is capable of forming a sharp black-and-white or color image which is excellent in decoloration of a non-image portion and has a high contrast can be provided.

What is claimed is:

1. A photopolymerizable composition, comprising a polymerizable compound having an ethylenically unsaturated bond, a compound represented by the following general formula (I), and a radical generating agent capable of generating a radicals by interacting with the compound represented by the general formula (I):

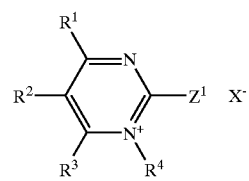

wherein, in the general formula (I), $R^1$, $R^2$, and $R^3$ each individually represent a hydrogen atom or a monovalent substituent;

$R^4$ represents at least one member selected from the group consisting of a hydrogen atom, an aliphatic group, an aromatic group, and a heterocyclic group;

$Z^1$ represents a substituent necessary for allowing the compound expressed by the general formula (1) to become a dye; and $X^-$ represents a group capable of forming an anion.

2. The photopolymerizable composition according to claim 1, wherein the radical generating agent is an organic boron compound.

3. The photopolymerizable composition according to claim 2, wherein the organic boron compound is a compound represented by the following general formula (II):

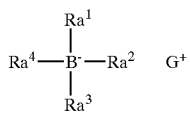

wherein, in the general formula (II), $R_a^1$, $R_a^2$, $R_a^3$, and $R_a^4$ each individually represent at least one member selected from the group consisting of: an aliphatic group, an aromatic group, a heterocyclic group, and $Si(R_a^5)(R_a^6)$—$R_a^7$, wherein $R_a^5$, $R_a^6$, and $R_a^7$ each individually represent at least one of an aliphatic group and an aromatic group; and $G^+$ represents a group capable of forming a cation.

4. A recording material comprising a support and a recording layer provided thereon, the recording layer comprising a photopolymerizable composition which comprises a polymerizable compound having an ethylenically unsaturated bond, a compound represented by the following general formula (I), and a radical generating agent capable of generating a radical by interacting with the compound represented by the general formula (I):

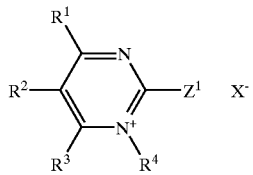

wherein, in the general formula (I), $R^1$, $R^2$, and $R^3$ each individually represent a hydrogen atom or a monovalent substituent;

$R^4$ represents at least one member selected from the group consisting of a hydrogen atom, an aliphatic group, an aromatic group, and a heterocyclic group;

$Z^1$ represents a substituent necessary for allowing the compound expressed by the general formula (1) to become a dye; and $X^-$ represents a group capable of forming an anion.

5. The recording material according to claim 4, wherein the radical generating agent is an organic boron compound.

6. The recording material according to claim 5, wherein the organic boron compound is a compound represented by the following general formula (II):

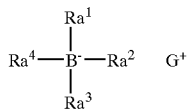

wherein, in the general formula (II), $R_a^1$, $R_a^2$, $R_a^3$, and $R_a^4$ each individually represent at least one member selected from the group consisting of an aliphatic group, an aromatic group, a heterocyclic group, and $Si(R_a^5)(R_a^6)$—$R_a^7$, wherein $R_a^5$, $R_a^6$, and $R_a^7$ each individually represent at least one of an aliphatic group and an aromatic group; and $G^+$ represents a group capable of forming a cation.

7. The recording material according to claim 4, wherein the recording layer further comprises at least a color forming component A, and a color forming component B having a portion which allows color to be formed by reacting with the color forming component A.

8. The recording material according to claim 5, wherein the recording layer further comprises at least a color forming component A, and a color forming component B having a portion which allows color to be formed by reacting with the color forming component A.

9. The recording material according to claim 6, wherein the recording layer comprises at least a color forming component A, and a color forming component B having a portion which allows color to be formed by reacting with the color forming component A.

10. The recording material according to claim 7, wherein the color forming component B is at least one polymerizable compound having an ethylenically unsaturated bond.

11. The recording material according to claim 8, wherein the color forming component B is at least one polymerizable compound having an ethylenically unsaturated bond.

12. The recording material according to claim 9, wherein the color forming component B is at least one polymerizable compound having an ethylenically unsaturated bond.

13. The recording material according to claim 7, wherein the polymerizable compound having an ethylenically unsaturated bond is a color-forming suppressing compound that contains in the same molecule a component that suppresses a reaction between the color forming component A and the color forming component B.

14. The recording material according to claim 8, wherein the polymerizable compound having an ethylenically unsaturated bond is a color-forming suppressing compound that contains in the same molecule a component that suppresses a reaction between the color forming component A and the color forming component B.

15. The recording material according to claim 9, wherein the polymerizable compound having an ethylenically unsaturated bond is a color-forming suppressing compound that contains in the same molecule a component that suppresses a reaction between the color forming component A and the color forming component B.

16. The recording material according to claim 7, wherein the color forming component A is encapsulatd in microcapsules.

17. The recording material according to claim 8, wherein the color forming component A is encapsulatd in microcapsules.

18. The recording material according to claim 9, wherein the color forming component A is encapsulatd in microcapsules.

19. The recording material according to claim 4, further comprising a multi-layer structure in which the first recording layer that is sensitive to light having a central wavelength $\lambda_1$, a second recording layer that is sensitive to light having a central wavelength $\lambda_2$ and forms a color different from that of the first recording layer, . . . , and an ith recording layer that is sensitive to light having a wavelength $\lambda_i$ and forms a color different from those of the first, second, . . . , and i−1th recording layers are laminated in this order.

* * * * *